United States Patent
Jang et al.

(10) Patent No.: US 11,032,025 B2
(45) Date of Patent: Jun. 8, 2021

(54) SEQUENCE GENERATION METHOD FOR POLAR CODE, STORAGE MEDIUM THEREOF, AND DATA TRANSMISSION METHOD AND APPARATUS USING SAME

(71) Applicants: Samsung Electronics Co., Ltd., Suwon-si (KR); Research & Business Foundation Sungkyunkwan University, Suwon-si (KR)

(72) Inventors: Min Jang, Seongnam-si (KR); Sanghyo Kim, Seongnam-si (KR); Jonghwan Kim, Suwon-si (KR); Yeonjoon Choi, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/623,353

(22) PCT Filed: Jun. 15, 2018

(86) PCT No.: PCT/KR2018/006811
§ 371 (c)(1),
(2) Date: Dec. 16, 2019

(87) PCT Pub. No.: WO2018/231023
PCT Pub. Date: Dec. 20, 2018

(65) Prior Publication Data
US 2020/0177309 A1 Jun. 4, 2020

(30) Foreign Application Priority Data
Jun. 16, 2017 (KR) .................. 10-2017-0076935

(51) Int. Cl.
*H04L 1/00* (2006.01)
*H03M 13/13* (2006.01)

(52) U.S. Cl.
CPC .......... *H04L 1/0057* (2013.01); *H03M 13/13* (2013.01); *H04L 1/0041* (2013.01); *H04L 1/0045* (2013.01)

(58) Field of Classification Search
CPC ... H04L 1/0057; H04L 1/0041; H04L 1/0045; H03M 13/13
See application file for complete search history.

(56) References Cited

U.S. PATENT DOCUMENTS 8,347,186 B1 1/2013 Arikan
2014/0173376 A1 6/2014 Jeong et al.
(Continued)

FOREIGN PATENT DOCUMENTS

| KR | 10-2014-0077492 A | 6/2014 |
| KR | 10-2015/0032197 A | 3/2015 |
| KR | 10-1617965 B1 | 5/2016 |

OTHER PUBLICATIONS

English Translation of the International Search Report of International Application No. PCT/KR2018/006811, International Searching Authority, Korean International Property Office, dated Sep. 27, 2018, pp. 1-2. (Year: 2018).*

(Continued)

*Primary Examiner* — Kyle Vallecillo

(57) ABSTRACT

The disclosure relates to a communication technique which fuses a 5G communication system with IoT technology to support higher data transmission rates after a 4G system, and system thereof. The disclosure can be applied to intelligent services (for example, smart home, smart building, smart city, smart connected car, health care, digital education, retail, security, and safety related services, and the like) on the basis of 5G communication technology and IoT related (Continued)

technology. A transmission method is provided, the method including: identifying at least one bit for polar coding, identifying a first sequence having a length of 2N that corresponds to a length of the at least one information bit, encoding the information bit through the polar coding, and transmitting the encoded information.

15 Claims, 18 Drawing Sheets

(56) References Cited

U.S. PATENT DOCUMENTS

| | | | |
|---|---|---|---|
| 2015/0077277 A1 | 3/2015 | Alhussien et al. | |
| 2015/0333769 A1* | 11/2015 | Jeong | H03M 13/271 714/790 |
| 2018/0248654 A1* | 8/2018 | Ge | H04L 1/0009 |
| 2018/0248655 A1* | 8/2018 | Belfiore | H03M 13/618 |

OTHER PUBLICATIONS

English Translation of the Written Opinion of the International Searching Authority of International Application No. PCT/KR2018/006811, International Searching Authority, Korean International Property Office, dated Sep. 27, 2018, pp. 1-7. (Year: 2018).*

ISA/KR, International Search Report and Written Opinion of the International Searching Authority, International Application No. PCT/KR2018/006811, dated Sep. 27, 2018, 12 pages.

Hyun, Kong Dong, et al., "Performance of Rate Flexibility of Polar Codes in accordance with Puncturing Order," Proceedings of the 2017 Korea Institute of Communications and Information Sciences (KICS) Winter Conference, Jan. 31, 2017, 63 pages.

Ju, Hyo-Sang, et al., "Performance of Parity-Check-Concatenated Polar Codes with Cyclic Redundancy Check," Proceedings of the 2017 Korea Institute of Communications and Information Sciences (KICS) Winter Conference, Jan. 31, 2017, 63 pages.

* cited by examiner

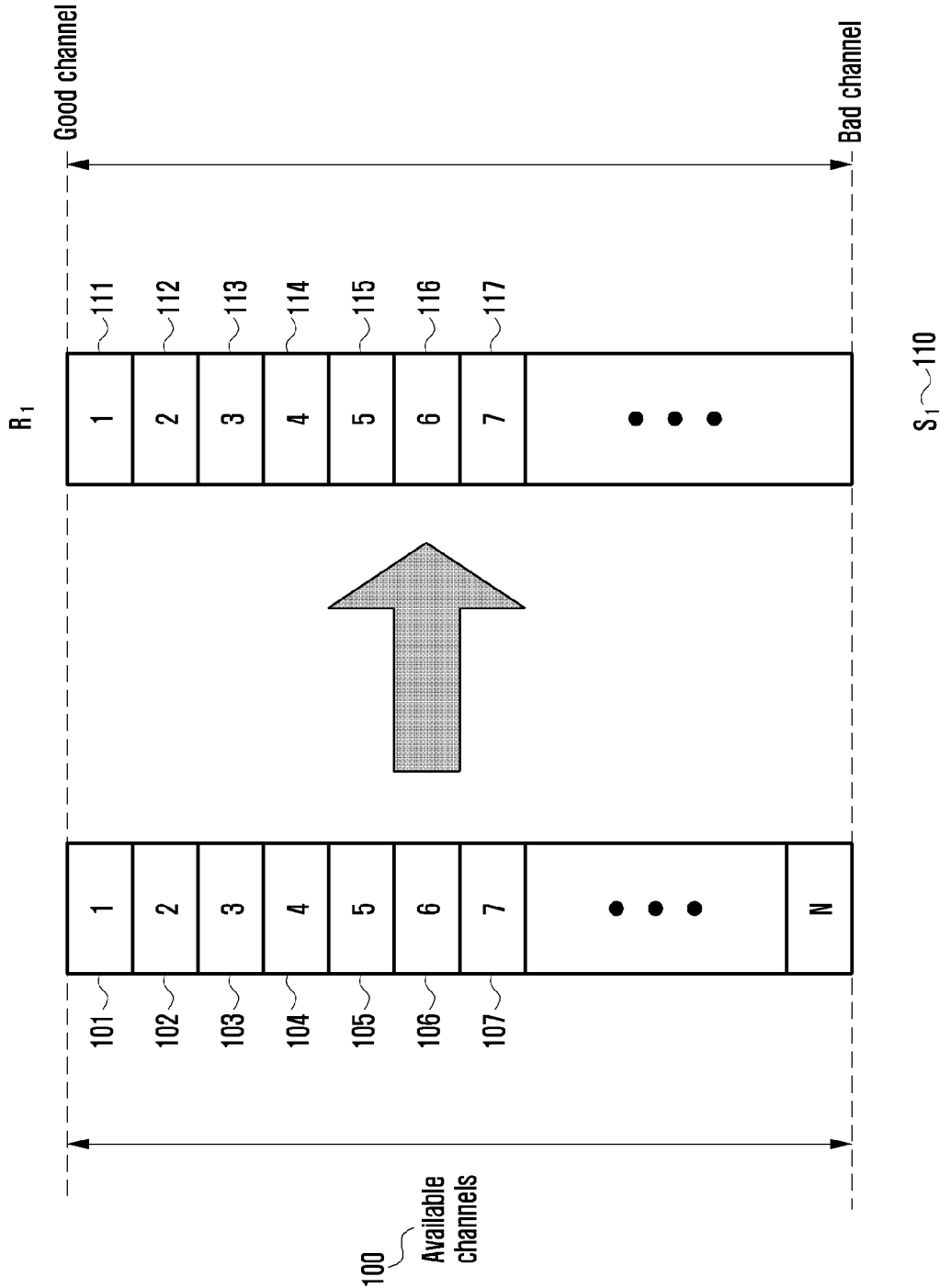

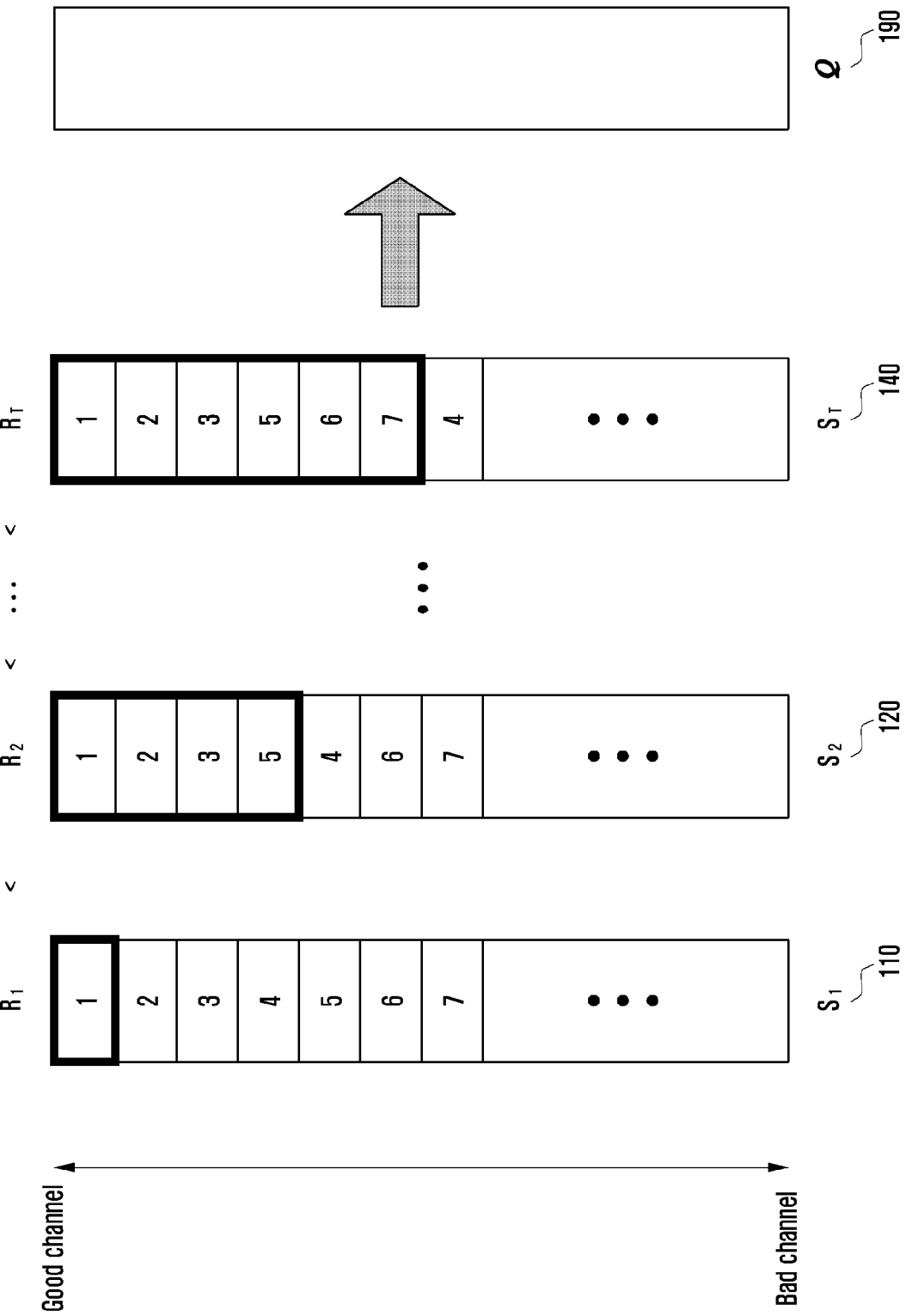

SEQUENCE GENERATION METHOD FOR POLAR CODE, STORAGE MEDIUM THEREOF, AND DATA TRANSMISSION METHOD AND APPARATUS USING SAME

CROSS-REFERENCE TO RELATED APPLICATIONS

This application is a 371 National Stage of international Application No. PCT/KR2018/006811, filed Jun. 15, 2018, which claims priority to Korean Patent Application No. 10-2017-0076935, filed Jun. 16, 2017, the disclosures of which are herein incorporated by reference in their entirety.

BACKGROUND

1. Field

The disclosure relates to a method and apparatus for encoding transmit data in a communication system and, in particular, to a method for generating a sequence for data encoding, a storage medium storing instructions for executing method, and a device using the method. Disclosed embodiments relate to a method for generating a symmetric sequence for a polar code, a storage medium storing instructions for executing the method, a device executing the method, and a method and apparatus for transmitting data using the same.

2. Description of Related Art

To meet the increased demand for wireless data traffic since the deployment of 4G communication systems, efforts have been made to develop an improved 5G or pre-5G communication system. Therefore, the 5G or pre-5G communication system is also called a "Beyond 4G Network" or a "Post LTE System". Implementation of the 5G communication system in higher frequency (mmWave) bands, e.g., 60 GHz bands, is being considered in order to accomplish higher data rates. To decrease propagation loss of radio waves and increase the transmission distance, beamforming, massive multiple-input multiple-output (MIMO), Full Dimensional MIMO (FD-MIMO), array antenna, analog beam forming, and large scale antenna techniques are being discussed for the 5G communication system. In addition, in the 5G communication system, there are developments under way for system network improvement based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation, and the like. In the 5G system, Hybrid FSK and QAM Modulation (FQAM) and sliding window superposition coding (SWSC) as advanced coding modulation (ACM) and filter bank multi carrier (FBMC), non-orthogonal multiple access (NOMA), and sparse code multiple access (SCMA) as advanced access technology have been developed.

The Internet, which is a human centered connectivity network where humans generate and consume information, is now evolving into the Internet of Things (IoT) where distributed entities, such as things, exchange and process information without human intervention. The Internet of Everything (IoE), which is a combination of IoT technology and Big Data processing technology through connection with a cloud server, has emerged. As technology elements, such as "sensing technology", "wired/wireless communication and network infrastructure", "service interface technology", and "security technology" have been demanded for IoT implementation, recently there has been research into a sensor network, Machine-to-Machine (M2M) communication, Machine Type Communication (MTC), and so forth. Such an IoT environment may provide intelligent Internet technology services that create new values for human life by collecting and analyzing data generated among connected things. The IoT may be applied to a variety of fields including smart home, smart building, smart city, smartcar or connected car, smart grid, health care, smart appliances, and advanced medical services through convergence and combination between existing Information Technology (IT) and various industrial applications.

In line with these developments, various attempts have been made to apply the 5G communication system to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be an example of convergence between the 5G technology and the IoT technology.

Typically in a communication system, a data error may occur in communication of data between a transmitter and a receiver, and noise in the communication channel is one of the common sources of error. An error correction code is designed to allow the receiver to correct errors occurring in the communication channel. The error correction code is also known as channel coding. Error correction coding techniques are characterized by transmitting redundant bits along with the data.

There are various error correction codes. Examples thereof include convolutional codes, turbo codes, low density parity check (LDDC) codes, and polar codes. Among them, polar codes are the first known codes with a theoretically proven probability of achieving point-to-point channel capacity using channel polarization. A polar code may be designed to be optimized to a channel or a code rate using density evolution, reciprocal channel approximation, etc. However, in order to apply a polar coding technique to a real communication system, it is necessary to store index sequences optimized at individual code rates in advance. A problem may arise in that storing such index sequences in advance increases memory complexity.

Meanwhile, the 5G mobile communication system as the next generation technical standard targets three scenarios: enhanced mobile broadband (eMBB), ultra-reliable and low latency communication (URLLC), and massive machine type communication (mMTC) scenarios. In order to guarantee a stable system structured sequence in the various scenarios, it is necessary to design an error correction code that is capable of supporting various code rates.

There is therefore a need of a coding method that is capable of providing services under the various scenarios without compromising the memory complexity.

SUMMARY

The disclosure has been proposed to solve to above problems and aims to provide a polar code design method for supporting various 5G mobile communication technology scenarios that is capable of designing a polar code supporting various code rates for channel-specific optimized structured sequences with a symmetrically-structured single index sequence and a data transmission device and method using the same.

The disclose also aims to provide a polar code design scheme that is capable of achieving a high structured sequence and reducing complexity and a data transmission apparatus and method using the designed polar code. The disclosure aims to provide a symmetrically-structured sequence design method that is capable of reducing memory complexity.

The disclosure also aims to provide a symmetrically-structured single index sequence design method that is capable of achieving code rate compatibility with low performance degradation in a real polar code utilization environment d a data transmission apparatus and method using the same.

Solution to Problem

According to an embodiment of the disclosure, an information transmission method includes identifying at least one information bit for polar coding, identifying a first sequence having a length of 2N that corresponds to a length of the at least one information bit, encoding the information hit through polar coding based on a first sequence, and transmitting the encoded information, wherein the first sequence comprising indices that form part of the first sequence is arranged symmetrically around a center of the first sequence.

According to another embodiment of the disclosure, an information transmission apparatus includes a transceiver configured to transmit and receive signals and at least one processor connected to the transceiver and configured to control to identify at least one information bit for polar coding, identify a first sequence having a length 2N that corresponds to a length of the at least one information bit, encode the information bit through polar coding based on a first sequence, and transmit the encoded information, wherein the first sequence comprising indices that form part of the first sequence is arranged symmetrically around a center of the first sequence.

According to another embodiment of the disclosure, an information reception method includes receiving information encoded through polar coding, identifying a first sequence having a length of 2N, and decoding the received information based on the first sequence, wherein the first sequence comprising indices that form part of the first sequence is arranged symmetrically around a center of the first sequence.

According to another embodiment of the disclosure, an information reception apparatus includes a transceiver configured to transmit and receive signals and a controller connected to the transceiver and configured to control to receive information encoded through polar coding, identify a first sequence having a length of 2N, and decode the received information based on the first sequence, wherein the first sequence comprising indices that form part of the first sequence is arranged symmetrically around a center of the first sequence.

According to another embodiment of the disclosure, a storage medium stores instructions being executed to perform a signal transmission method of a disclosed embodiment.

Advantageous Effects of Invention

The disclosed approach is advantageous in terms of improving signal transmission/reception efficiency by providing a sequence for polar code encoding. The proposed approach is also advantageous in terms of making it possible to support various scenarios for real 5G mobile communication technologies by designing a polar code supporting various channel-specific code rates optimizing a structured sequence with a symmetrically-structured single index sequence. The disclosed approach is also advantageous in terms of guaranteeing a high structured sequence even under various code rates and reducing memory complexity of storing symmetrically-structured sequences.

BRIEF DESCRIPTION OF THE DRAWINGS

FIGS. 1A to 1C are diagrams illustrating a procedure for designing a sequence optimized at a certain code rate according to a disclosed embodiment;

SUMMARY

Figure 1B:
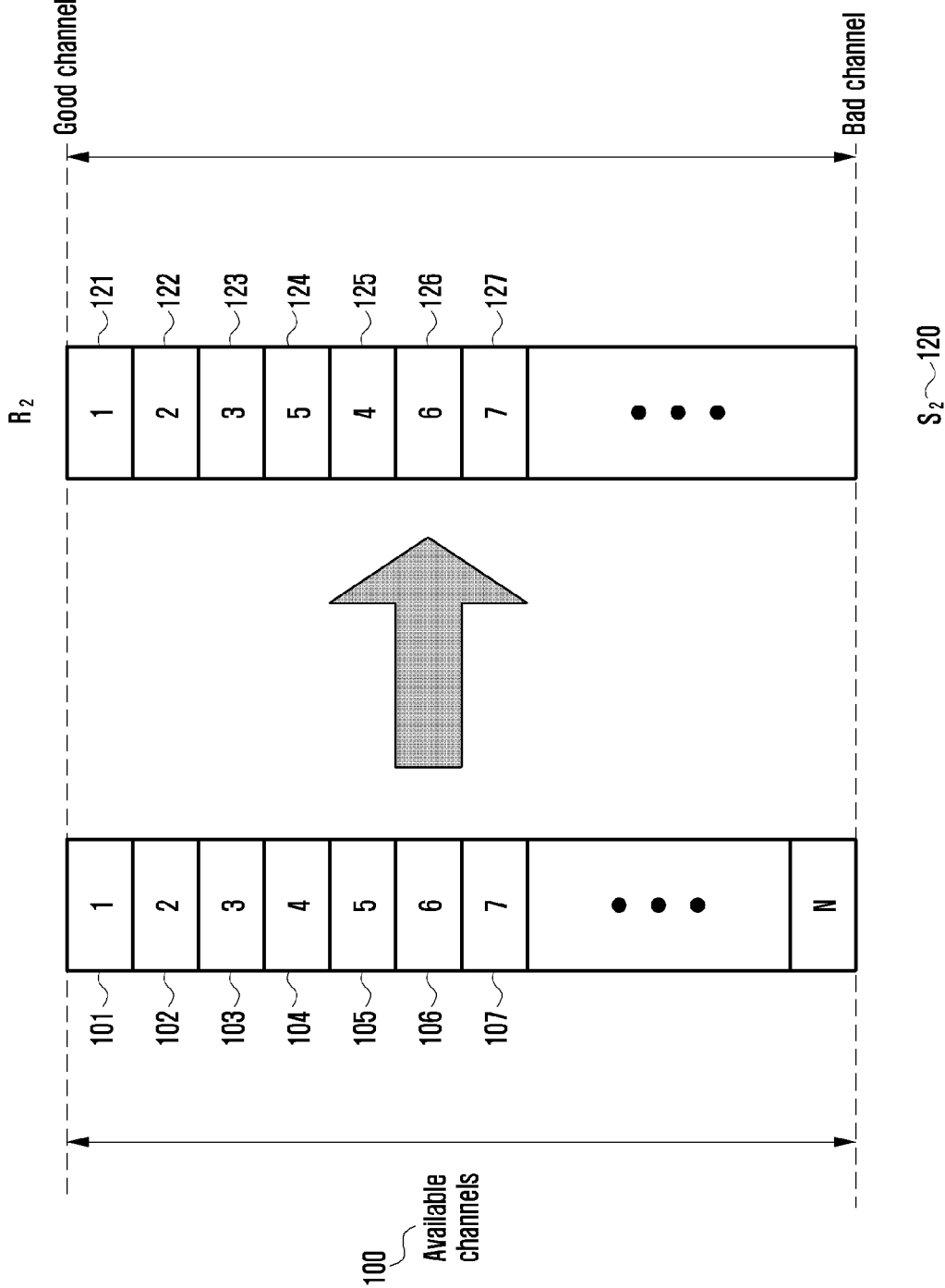

Exemplary embodiments of the disclosure are described in detail with reference to the accompanying drawings.

Detailed descriptions of technical specifications well-known in the art and unrelated directly to the disclosure may be omitted to avoid obscuring the subject matter of the disclosure. This aims to omit unnecessary description so as to make the subject matter of the disclosure clear.

For the same reason, some elements are exaggerated, omitted, or simplified in the drawings and, in practice, the elements may have sizes and/or shapes different from those shown in the drawings. Throughout the drawings, the same or equivalent parts are indicated by the same reference numbers.

Advantages and features of the disclosure and methods of accomplishing the same may be understood more readily by reference to the following detailed descriptions of exemplary embodiments and the accompanying drawings. The disclosure may, however, be embodied in many different forms and should not be construed as being limited to the exemplary embodiments set forth herein; rather, these exemplary embodiments are provided so that this disclosure will be thorough and complete and will fully convey the concept of the disclosure to those skilled in the art, and the disclosure will only be defined by the appended claims. Like reference numerals refer to like elements throughout the specification.

It will be understood that each block of the flowcharts and/or block diagrams, and combinations of blocks in the flowcharts and/or block diagrams, can be implemented by computer program instructions. These computer program instructions may be provided to a processor of a general-purpose computer, special purpose computer, or other programmable data processing apparatus, such that the instructions that are executed via the processor of the computer or other programmable data processing apparatus create means for implementing the functions/acts specified in the flowcharts and/or block diagrams. These computer program instructions may also be stored in a non-transitory computer-readable memory that can direct a computer or other programmable data processing apparatus to function in a particular manner, such that the instructions stored in the non-transitory computer-readable memory produce articles of manufacture embedding instruction means that implement the function/act specified in the flowcharts and/or block diagrams. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions/acts specified in the flowcharts and/or block diagrams.

Furthermore, the respective block diagrams may illustrate parts of modules, segments, or codes including at least one or more executable instructions for performing specific logic function(s). Moreover, it should be noted that the functions of the blocks may be performed in a different order in several modifications. For example, two successive blocks may be performed substantially at the same time, or they may be performed in reverse order according to their functions.

According to various embodiments of the disclosure, the term "module", means, but is not limited to, a software or hardware component, such as a Field Programmable Gate Array (FPGA) or Application Specific Integrated Circuit (ASIC), which performs certain tasks. A module may advantageously be configured to reside on the addressable storage medium and configured to be executed on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionalities of the components and modules may be combined into fewer components and modules or further separated into more components and modules. In addition, the components and modules may be implemented such that they execute one or more CPUs in a device or a secure multimedia card.

Exemplary embodiments of the present invention are described in detail with reference to the accompanying drawings. The same reference numbers are used throughout the drawings to refer to the same or like parts. It is noted that the accompanying drawings are provided to help understand the present invention and are not intended to limit the invention thereto. Detailed descriptions of well-known functions and structures incorporated herein may be omitted to avoid obscuring the subject matter of the present invention. It should be noted that the following description is made only of the parts necessary to help understand the operations according to various embodiments of the present invention, and not of other parts, to avoid obscuring the subject matter of the present invention.

The polar coding of a disclosed embodiment is characterized as follows. There is a need of designing a single index sequence that is capable of achieving code rate compatibility with low performance degradation under various channel qualities and code rates in view of practical use of the polar code in a wireless communication and broadcast system. There are many well-known methods for generating an optimized index sequence of a polar code using a density evolution scheme under various code rates. In order to use a density evolution scheme, it is necessary to design an optimized polar code that is capable of achieving best channel-specific performance in consideration of different channel environments.

As a method for solving the code rate compatibility problem, a code design method without use of the legacy density evolution scheme has been proposed. The code design method without use of the density evolution is characterized by assessing per-channel reliabilities using a simplified polynomial equation with a binary expression of an index rather than measuring channel reliabilities, when selecting a channel index for transmitting an information bit. This method may be expressed in the form of an equation with a per-channel index of $i \triangleq B_{n-1}B_{n-2} \ldots B_0$ where $B_j \in \{0,1\}$, and $B_i=0$ means channel degradation and $B_i=1$ means upgrading a channel in a channel polarization process. The reliability of a channel index satisfying the above conditions may be calculated by Equation (1).

$$W_i = \sum_{j=0}^{n-1} B_j \cdot 2^{\frac{j}{4}} \tag{1}$$

For example, the reliability of index i=7 that is measured with a code length n=4 is calculated by Equation (2).

$$W_7 = 1*2^{(0*\frac{1}{4})} + 1*2^{(1*\frac{1}{4})} + 1*2^{(2*\frac{1}{4})} + 0*2^{(3*\frac{1}{4})} = 3.6034 \tag{2}$$

The reliability of each channel may be calculated by the simplified polynomial such as Equation (2), and per-channel reliabilities $W_0^{N-1}$ are sorted in an ascending order. Here, if the channel reliabilities satisfy a relationship of $W_{Q_0} \leq W_{Q_1} \leq W_{Q_2} \leq \ldots \leq W_{Q_N}$, the ascending order alignment results in $[W_{Q_0}, W_{Q_1}, W_{Q_2}, \ldots W_{Q_N}]$. From the channel reliabilities aligned as above, an index sequence $Q_0^{N-1}$ is selected as a single index sequence for a code design. In this manner, a sequence for use in polar coding may be designed by calculating channel reliabilities of each code and generating an index based on the channel reliabilities.

As described above, storing all index sequences optimized at various code rates to support various scenarios of the 5G mobile communication technologies is inefficient in view of memory complexity. In more detail, the optimized index may vary according to the code length, which leads to memory waste in the case of storing all sequences per code length.

In order to solve the above problem, a legacy polar code design method is characterized by expressing measured per-channel reliabilities in the form of a simplified polynomial and generating a single index sequence by aligning the reliabilities. However, the code designed with the simplified polynomial cannot achieve the best structured sequence at each code rate because it is not optimized per channel. Accordingly, the simplified polynomial-based method is limited in designing a code optimizing structured sequence per channel although it is possible to design a polar code without severe structured sequence degradation at various code rates.

Hereinafter, a description is made of the coding apparatus and method using a symmetrically- or partially symmetrically-structured 2N-length sequence designed based on a sequence designed with a length of N. In the case of using the symmetrically- or partially symmetrically-structured 2N-length sequence, it may be possible to use the whole 2N sequence by storing all or part of the N-length sequence, which leads to implementation of polar coding with relatively small memory. In an embodiment, the polar code length N may be a positive even integer and correspond to a powers of 2.

According to a disclosed embodiment, a symmetrically-structured index sequence with a length of 2N may be generated based on an index sequence designed with the length of N. According to a disclosed embodiment, it may be possible to generate a symmetrically-structured 2N-length index sequence that is capable of achieving the best structured sequence at various code rates. Designing the index sequence to have the length of 2N make it possible to store half the sequence, i.e., N-length sequence, for retrieving the 2N-length sequence afterword, which leads to a 50% reduction in memory usage.

According to a disclosed embodiment, a partially symmetrically-structured index sequence with a length of 2N may be generated based on an index sequence designed with the length of N. According to a disclosed embodiment, it may be possible to generate a symmetrically-structured 2N-length index sequence that is capable of achieving the best structured sequence at various code rates. Designing the index sequence to have the length of 2N makes it possible to store one half of the sequence, i.e., N-length sequence, and an asymmetric part of the other half for retrieving the 2N-length sequence afterword, which leads to a 30% reduction in memory usage. According to a disclosed embodiment, it is possible to reduce the memory usage by about 40%.

FIGS. 1A to 1C are diagrams illustrating a procedure for designing a sequence optimized at a predetermined code rate according to a disclosed embodiment.

In reference to FIG. 1A, it may be possible to assign indices to channels available in a communication system for a code rate $R_1$. For example, assuming that there are N available channels 100, if the N channels are each assigned an index, N indices are assigned in the order of 1, 2, 4, 5, 6, 7, . . . , N.

Reference number 101 denotes available channel 1, reference number 102 denotes available channel 2, reference number 103 denotes available channel 3, reference number 104 denotes available channel 4, reference number 105 denotes available channel 5, reference number 106 denotes available channel 6, and reference number 107 denotes available channel 7.

In this case, per-channel error rates may be calculated using a density evolution or another optimization method at a specific polar code rate $R_1$. The channel indices may be aligned in a descending order of channel quality, i.e., from the best to the poorest channels, based on the per-channel error rates calculated at code rate $R_1$ to generate an optimized bit channel index sequence.

In the embodiment of FIG. 1A, the available channels 100 sorted in the order of the channel quality from the best to the poorest channels have bit channel index sequences ranking in the same order as the available channels for convenience of explanation. However, it is obvious to those skilled in the art that the indices of the available channels may be sorted in a different order of the best to the poorest channels in a real environment. For example, in the case of aligning the bit channel index sequences in the order of channel quality from the best to the poorest channels at a specific code rate $R_1$ in a real environment, the order may be determined as "6, m−5, 3, m+2, 4, 2, . . . ". Here, m is an integer greater than 1 and less than N. Although the smallest index is assigned to the best channel for convenience of explanation in the disclosed embodiment, the indices may be aligned to the channels in a different manner.

In the disclosed embodiment, it may be possible assign the bit channel indices to the channels in the order from the best to the poorest channels at the specific code rate $R_1$, i.e., reference number 111 denotes the available channel 1 as the first-best channel best channel, reference number 112 denotes the available channel 2 as the second-best channel, reference number 113 denotes the available channel 3 as the third-best channel, reference number 114 denotes the available channel 4 as the fourth-best channel, reference number 115 denotes the available channel 5 as the fifth-best channel, reference number 116 denotes the available channel 6 as the sixth-best channel, and reference number 117 denotes the available channel 7 as the seventh-best channel. In the following description, the optimized bit channel index sequences obtained by aligning the channel indices in a descending order of channel condition from the best to the poorest channels based on the error rate calculated per channel at the specific code rate $R_1$ is referred to as $S_1$ 110.

In the disclosed embodiment, the reference number of each channel index is changed to express that the channel index number can be changed according to the code rate. In this manner, it is possible to acquire sequences aligned based on channel quality factors of the available channels using a density revolution scheme.

Hereinafter, a description is made of the optimized bit channel index sequence $S_2$ 120 obtained by aligning the channel indices in a descending order of channel conditions from the best to poorest channels based on the error rate calculated per channel at another specific code rate $R_2$ with reference to FIG. 1B.

In comparison with FIG. 1A, it is shown that the code rate is changed from $R_1$ to $R_2$ and the optimized bit channel index sequences are changed from $S_1$ 110 to $S_2$ 120 in FIG. 1B. It is also shown that the optimized bit channel index sequence $S_2$ 120 at code rate $R_2$ 120 differs from the optimized bit channel index sequence $S_1$ 110 in index ranking order. That is, the channel index 1 121 of the first-best channel, the channel index 2 122 of the second-best channel, and the channel index 3 123 of the third-best channel at code rate $R_2$ are equal in rank to those at the core rate $R_1$. Meanwhile, the fourth-best channel at code rate $R_2$ has the channel index 5 124 that differs from the channel index 4 114 of the fourth-best channel at code rate $R_1$. The channel index 4 125 of the fifth-best channel at code rate $R_2$ also differs from the channel index 5 115 of the fifth-best channel at code rate $R_1$.

As shown in the embodiments of FIGS. 1A and 1B, the optimized channel indices may vary or not at different code rates. That is, if the code rate varies, the optimized bit channel index sequence may vary too.

Accordingly, in a certain communication system using T code rates, it may be possible to design the optimized bit channel index sequence $S_1$ 110 at code rate the optimized bit channel index sequence $S_2$ 120 at code rate $R_2$, and the optimized bit channel index sequence $S_T$ 140 at code rate $R_T$ using a density evolution scheme as shown in FIG. 1C.

In a disclosed embodiment, it may be possible to produce a bit channel index sequence to be applied to a final polar coding scheme that can be used at all code rates based on the bit channel index sequences $S_1$ 110, $S_2$ 120, . . . , $S_T$ 140 optimized at different code rates, as described above.

In an disclosed embodiment, it may be possible to use 2N-length optimized index sequences $\{S_1, S_2, \ldots, S_T\}$ at T code rates $\{R_1, R_2, \ldots, R_T\}$ for use in a communication system and produce N-length symmetrically-structured index sequences using the indices of a sequence pre-designed at length N. Here, the code rate $R_i = k_i/N$ where $k_i$ denotes a number of channels for use in transmitting data among N bit channels. Because the channels having a low error rate at each code rate are used for data transmission, the channels for use in transmitting data may be selected in order from the highest ranked channel index.

As shown in the embodiment of FIG. 1A, one data channel is selected for the case where $k_1=1$ at code rate $R_1$; as shown in the embodiment of FIG. 1B, four data channels are selected for the case where $k_2=4$ at code rate $R_2$. In the following description, a set of channel indices selected for data channels as described above may be referred to as an information set, and the information set per code rate may be referred to as $A_i$. The information sets at the code rates selected in the embodiments of 1A and 1B may be expressed as $A_1=\{1\}$ and $A_2=\{1, 2, 3, 5\}$, respectively.

Before undertaking the detailed description of the symmetrically-structured sequence design method according to a disclosed embodiment, a penalty $W_j$ at bit index j is defined by Equation (3). In detail, an impact of each index to the code performance at each code rate may be referred to as "penalty" hereinafter.

$$W_j = \Sigma_i \alpha_i \{P_i(E_j) - P_i(E_{worst})\}^+ \quad (3)$$

In Equation (3), $P_i(E_j)$ denotes the error rate at index j of sequence $S_i$, $P_i(E_{worst})$ denotes the highest error rate value at an index belonging to an intersection between an index group excluding a currently optimized final bit channel index sequence Q 190 and a set $A_i$. Here, $\alpha_i$ denotes a parameter reflecting the importance of a code rate. For example, if all code rates have the same importance, $\alpha_i$ has the same value at all the code rates; if code rate i is more important than code rate i', $\alpha_{i'} < \alpha_i$.

In Equation (3), operation $\{\bullet\}^+$ outputs, if the value inside $\{\ \}$ is a positive number, the value as it is and, if the value inside $\{\ \}$ is a negative number, 0. That is, in Equation (3), $\alpha_i\{P_i(E_j)-P_i(E_{worst})\}^+$ denotes a performance loss when the bit index j impacts to the code with a code rate of and has a value of 0 or higher; as the value increases, the impact to the structured sequence degradation increases. Accordingly, the penalty $W_j$ may become a parameter indicating the performance loss when the bit index j impacts the code with the code rate $R_i$. Here, $\alpha_i$ denotes a parameter for reflecting the importance of the sequence $S_i$ designed to be suitable for each code rate. However, there may be various methods for defining the penalty. For example, it may be possible to use an operation taking only the maximum value rather than the sum. For example, it may be possible to express the penalty as Equation (4).

$$(W_j = \max\{P_i(E_j) - P_i(E_{worst})\} \quad (4)$$

In the case where polar code sequences for T code rates are defined, it may be possible to measure the performance loss caused by inclusion of each index at the next code rates using the above defined penalty-related equation and to design a sequence minimizing performance degradation at various code rates based thereon.

Figure 2:
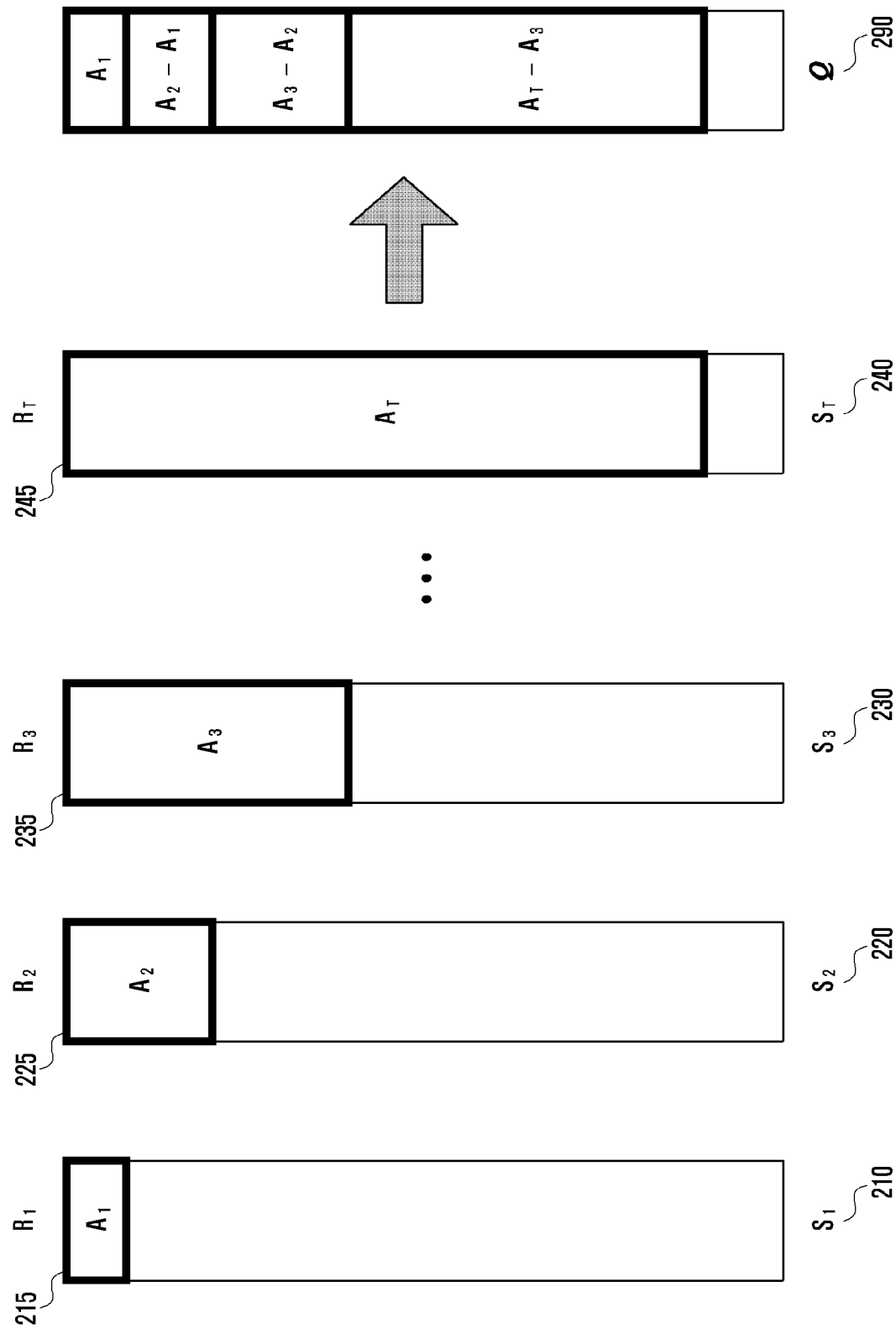
FIG. 2 is a conceptual diagram illustrating a method for designing a polar code sequence according to a disclosed embodiment.

FIG. 2 is a conceptual diagram illustrating a method for designing a polar code sequence according to a disclosed embodiment.

In reference to FIG. 2, it may be possible to design a bit channel index sequence $S_1$ 210 optimized at code rate $R_1$, a bit channel index sequence $S_2$ 220 optimized at code rate $R_2$, a bit channel index sequence $S_3$ 230 optimized at code rate $R_3$, and a bit channel index sequence $S_T$ 240 optimized at code rate $R_T$, using density evolution.

In an embodiment, it may be possible to obtain a bit channel index sequence to be applied to the final polar coding scheme using the bit channel index sequences $S_1$ 110, $S_2$ 120, $S_3$ 130 . . . , $S_T$ 240 optimized at the respective code rates. Here, the final bit channel index sequence Q 290 may be determined by combining the sequences $S_1$ 110, $S_2$ 120, $S_3$ 130 . . . , $S_T$ 240. In more detail, the final bit channel index Q 290 may obtained by adding the sequences $S_1$ 110, $S_2$ 120, $S_3$ 130 . . . , $S_T$ 240 in order. However, the sequences $S_T$ 240 and Q 290 may differ in a ranking order of the indices from each other. Only part of the indices of sequence Q 290 may have ranks higher than those in sequence $S_T$ 240. In the case of arranging the indices of the sequence Q 290 optimized at code rate $R_7$, the ranks of the indices may be identical in both the sequences Q 290 and $S_T$ 240. Accordingly, it may be possible to implement polar coding only with the sequence Q 290 by selecting indices at the corresponding code rate and assigning transmit data in the order of channel performance of the corresponding indices.

Figure 3:
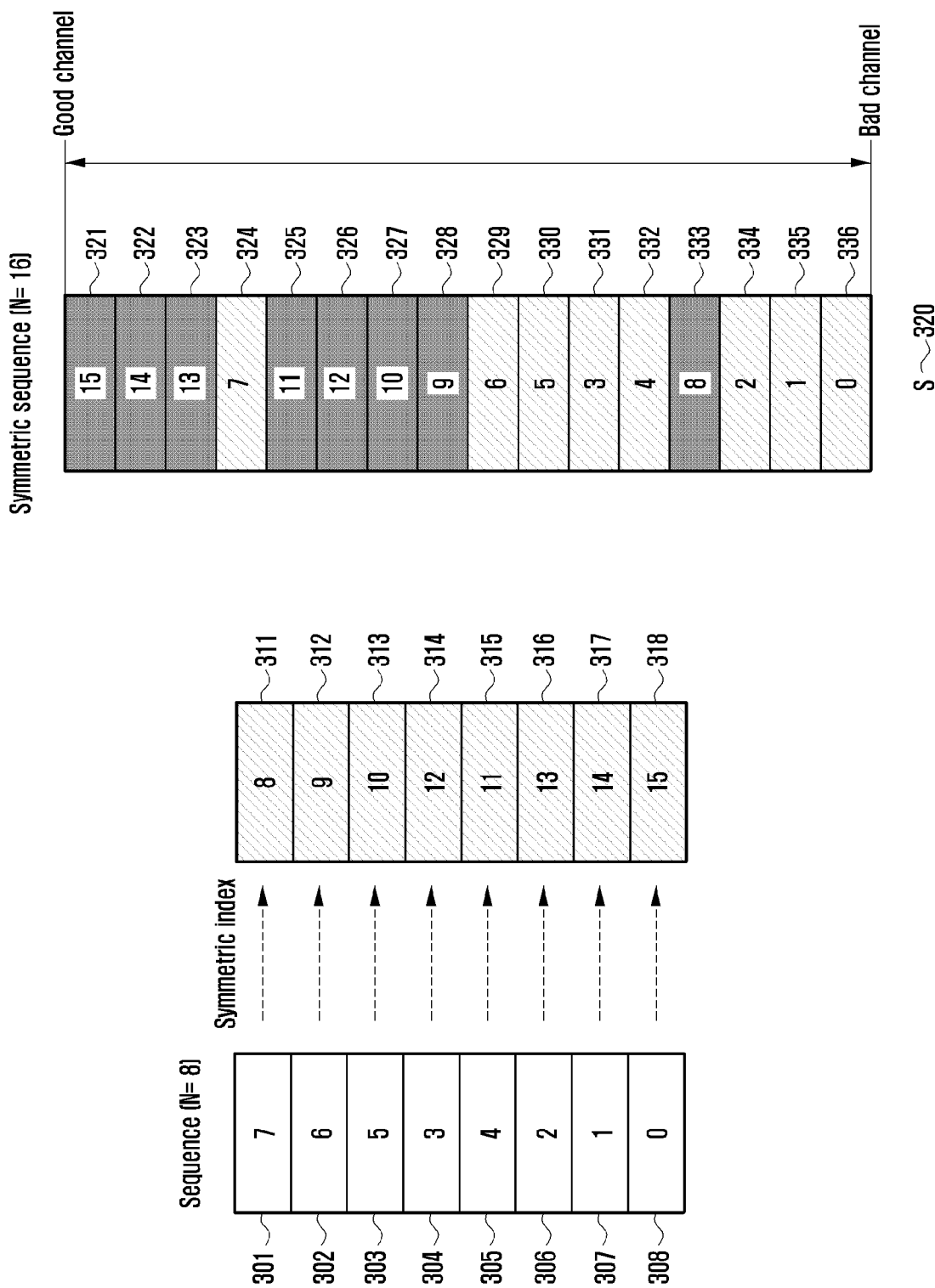
FIG. 3 is a diagram illustrating a method for generating a symmetric polar code sequence according to a disclosed embodiment.
Figure 4:
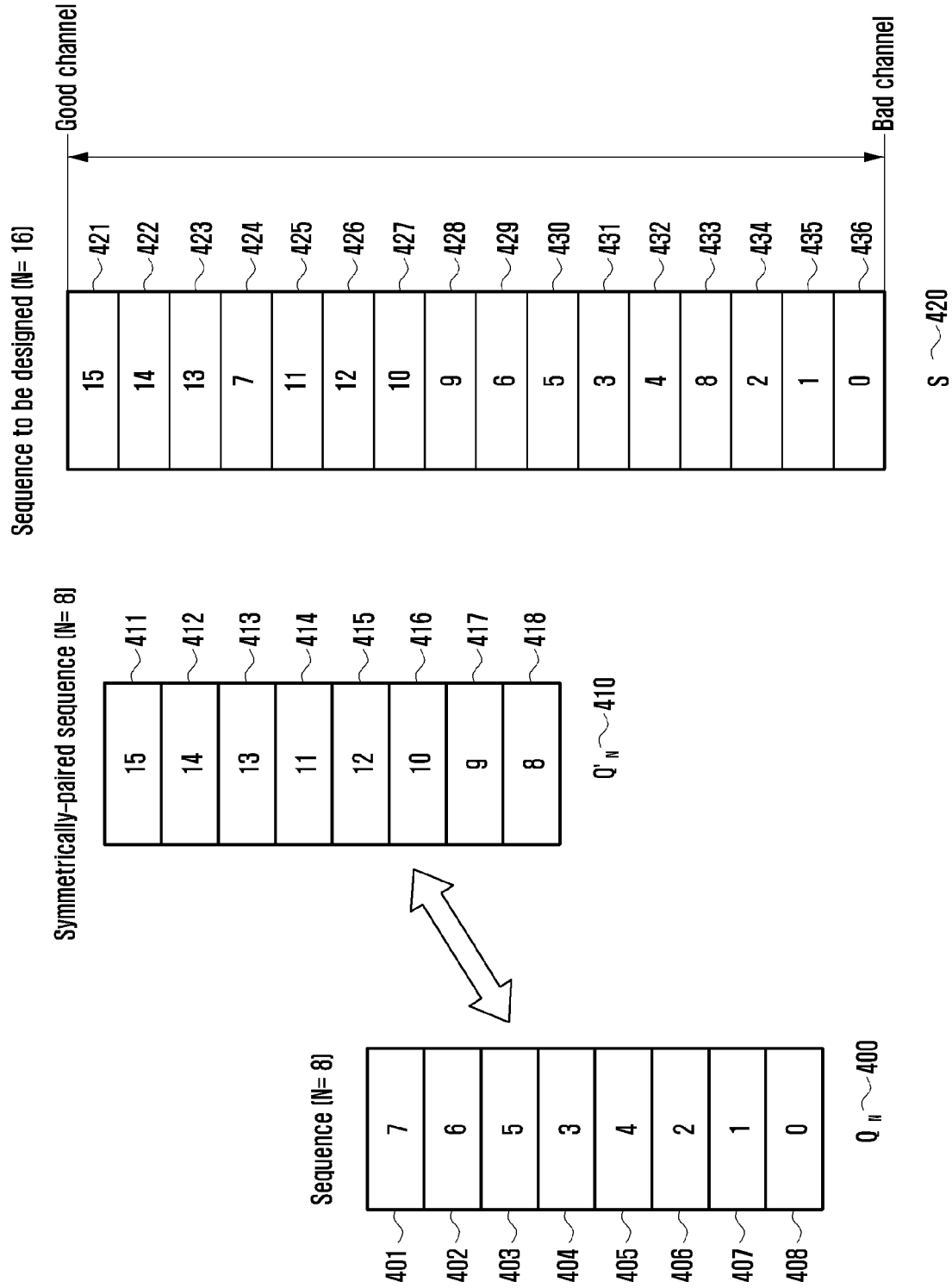
FIG. 4 is a diagram illustrating a method for designing a 2N-length symmetrically-structured sequence while maintaining a sequence for a polar code according to a disclosed embodiment.

FIG. 3 is a diagram illustrating a method for generating a symmetric polar code sequence according to a disclosed embodiment, and FIG. 4 is a diagram illustrating a method for designing a 2N-length symmetrically-structured sequence while maintaining a sequence for a polar code according to a disclosed embodiment.

In reference to FIG. 3, a sequence of symmetric indices is designed at code length N=8, and a sequence S 320 of symmetric indices is designed at code length N=16 based thereon; reference number 301 denotes index 7 of the first-best channel in the sequence designed at N=7, reference number 302 denotes index 6 of the second-best channel, reference number 303 denotes index 5 of the third-best channel, reference number 304 denotes index 3 of the fourth-best channel, reference number 305 denotes index 4 of the fifth-best channel, reference number 306 denotes index 2 of the sixth-best channel, reference number 307 denotes index 1 of the seventh-best channel, and reference number 308 denotes index 0 of the worst channel.

A sequence $Q_N$ optimized at length N is designed to obtain a 2N-length symmetrically-structured sequence. Here, the symmetrically-structured sequence means a sequence designed such that index 15 321 and index 0 336 are symmetric in the sequence at code length N=16 in the case where the 2N-length index sequence includes indices i=0, 1,2, ..., 2N as shown in FIG. 3. A 2N-length symmetrically-structured sequence may be designed such that the order of the indices of the sequence $Q_N$ is maintained as shown in FIG. 4 in which a symmertrically-structured index sequence S 420 with length 2N=16 is designed such that index orders of the sequence $Q_N$ 400 designed at length N=8 and the symmetrically-paired sequence $Q_{N'}$ 410 are maintained. That is, the sequence S 420 to be designed at length 2N is assigned indices in order. In more detail, in the case of adding an index at the top of the sequence, it may be possible to calculate penalties of the best channel index 7 401 of the N-length sequence $Q_N$ 400 and the best channel index 15 411 of sequence $Q_{N'}$ 410 using T sequences $\{S_1, S_2, \ldots, S_T\}$ designed to be optimized at T code rates "$\{R_1, R_2, \ldots, R_T\}$" at N=16 and add the index with the lowest penalty between the two indices to sequence S 420 and an index that is symmetrically paired with the selected index to a sequence at a symmetric location of sequence S 420. That is, if index 15 411 of sequence $Q_{N'}$ has a penalty value less than that of index 7 401 of sequence $Q_N$, index 15 is added to a location 421 of the 2N-length sequence S 420, and index 0 that is symmetrically-paired with index 15 is added to the symmetrical location 436 of the location 421 in sequence S.

Next, it may be possible to compare the penalty values of index 7 401 of sequence $Q_N$ and index 14 412 of sequence $Q_{N'}$ and, if the penalty value of index 14 412 is less than the other, add index 14 412 to a location 422 of sequence S 420 and index 1 407 corresponding thereto to a location 435 of sequence S 420. Next, it may be possible to compare the penalty values of index 7 401 of $Q_N$ and index 13 413 of $Q_{N'}$ and, if the penalty value of index 13 413 is less than the other, add index 13 413 to a location 423 of sequence S 420 and index 2 406 corresponding thereto to a location 434 of sequence S 420. Next, it may be possible to compare the penalty values of index 7 401 of $Q_N$ and index 11 414 of $Q_{N'}$ and, if the penalty value of index 7 407 is less than the other, add index 7 401 to a location 424 of sequence S 420 and index 1 407 corresponding thereto to a location 435 of sequence S 420. In the disclosed embodiments, exemplary penalty values are used, and it may be possible to design a 2N-length symmetrically-structured sequence while maintaining the sequence for a polar code by comparing the penalty values of the paired sequences in order and add the paired indices to the sequence S to be designed as described above.

In the above-described manner, it is possible to design a 2N-length symmetrically-structured sequence while maintaining sequence $Q_N$ 400 designed at code length N=8 and, in this case, the orders of the indices of sequence $Q_N$ 400 and its symmetrically-paired sequence $Q_{N'}$ 410 are maintained in the symmetrically-structured sequence. In more detail, if a sequence with length N=8 is necessary, it may be possible to use a sequence of indices 0 to 7 in sequence S 420. This makes it possible to store a sequence and use part of the stored sequence for polar coding according to the code rate.

Figure 5A:
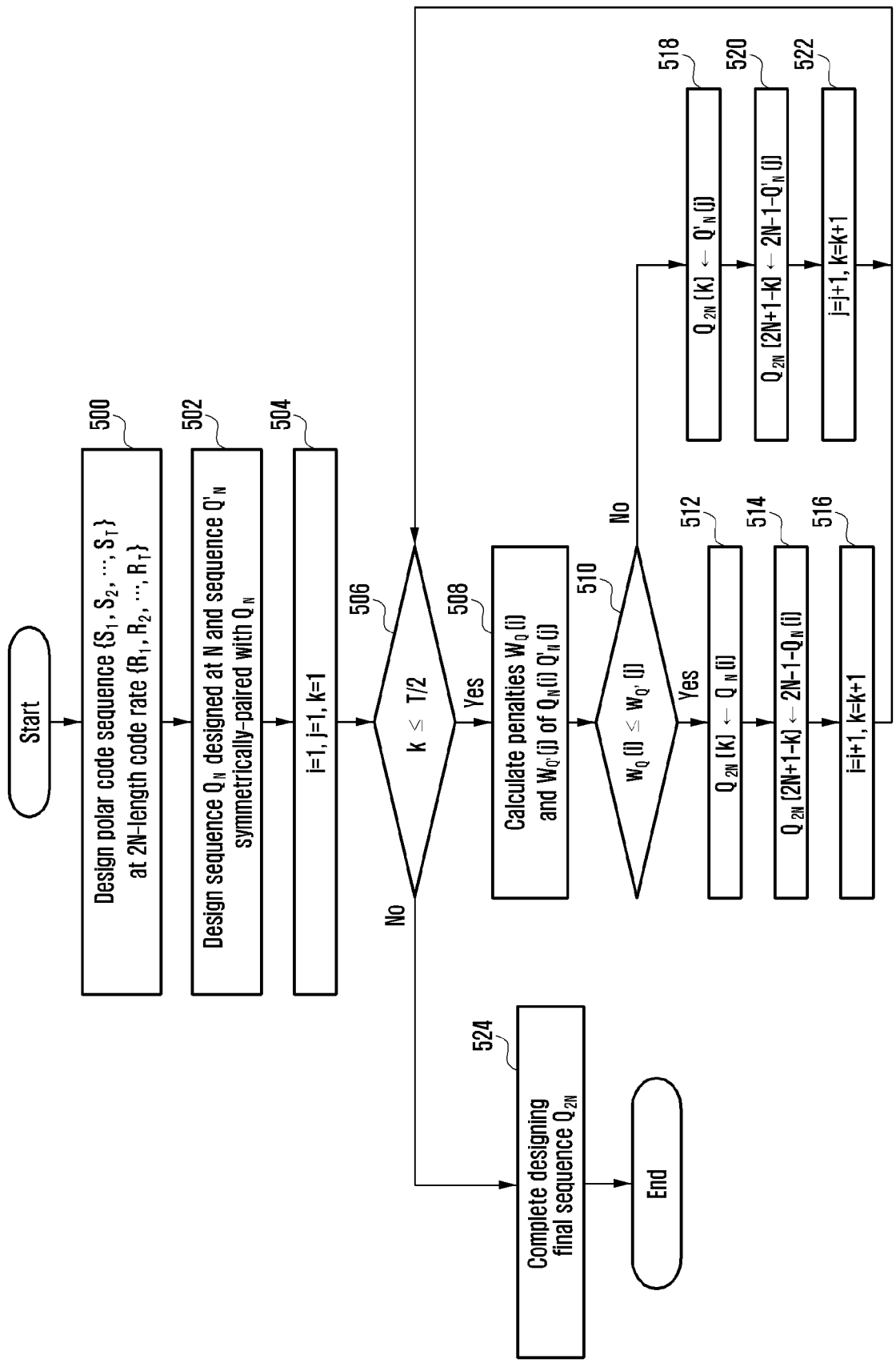
FIG. 5A is a flowchart illustrating a method for designing a sequence according to a disclosed embodiment.

FIG. 5A is a flowchart illustrating a method for designing a sequence according to a disclosed embodiment.

In reference to FIG. 5A, the design method may be iteratively performed to obtain a symmetrically-structured sequence.

At step 500, it may be possible to generate bit channel index sequences $S_1, S_2, \ldots, S_T$ optimized at different code rates, e.g., $R_1, R_2, \ldots, R_T$, at a code length of 2N.

At step 502, it may be possible to design a sequence $Q_N$ and its symmetrically-paired sequence $Q_{N'}$ that have a performance equal to r greater than a threshold at various code rates at code length N. In an embodiment, the threshold may be a value corresponding to a lowest error rate.

At step 504, it may be possible to set each of i, j, and k to 1. In an embodiment, i denotes an index corresponding to the designed sequence $Q_N$, j denotes an index corresponding to the symmetrically-paired sequence $Q_{N'}$, and k denotes air index corresponding to a finally designed sequence $Q_{2N}$.

At step 506, it may be possible to determine whether k is greater than T/2. In an embodiment, if k is greater than T/2, this means that the final sequence design is completed, given that the procedure is performed to generate a symmetrically-structured sequence.

At step 508, it may be possible to calculate penalties $W_Q(i)$ and $W_Q(j)$ of the $i^{th}$ index $Q_N(i)$ of the sequence $Q_N$ designed at code length N and the $j^{th}$ index $Q_N(j)$ of the symmetrically-paired sequence $Q_{N'}$ of sequence $Q_N$.

At step 510, it may be possible to compare the calculated penalty values.

At steps 512 to 522, the indices having a low penalty value are selectively added to sequence $Q_{2N}(k)$. For example, if the penalty of index $Q_N(i)$ is less than the penalty of index $Q_N(j)$, index $Q_N(i)$ is added to sequence $Q_{2N}(k)$ at step 512 and, in the same manner, index $N-1-Q_N(i)$ is added to sequence $Q_{2N}(N+1-k)$ such that sequence $Q_{2N}$ is designed to have a symmetrical structure. Afterward, i and k are each increased by 1 at step 516, and the procedure goes to step 506.

In the disclosed embodiments, because of being designed to maintain the order of the indices of a specific N-length sequence, the 2N-length symmetrically-structure index sequence generated by the symmetrically-structure index sequence generation method may be inferior to a 2N-length sequence that is asymmetrically designed based on penalty values in view of structured sequence degradation. A disclosed embodiment proposes a second symmetrically-structured index sequence design method that is capable of mitigating structured sequence degradation of the 2N-length symmetrically-structured sequence. In an embodiment, the penalty value may be expressed as encoding gain. In more detail, it may be understood that the encoding gain decreases as the penalty value increases; thus, the sequences may be generated to have the indices sorted in order from the greatest to the least encoding gains.

Figure 5B:
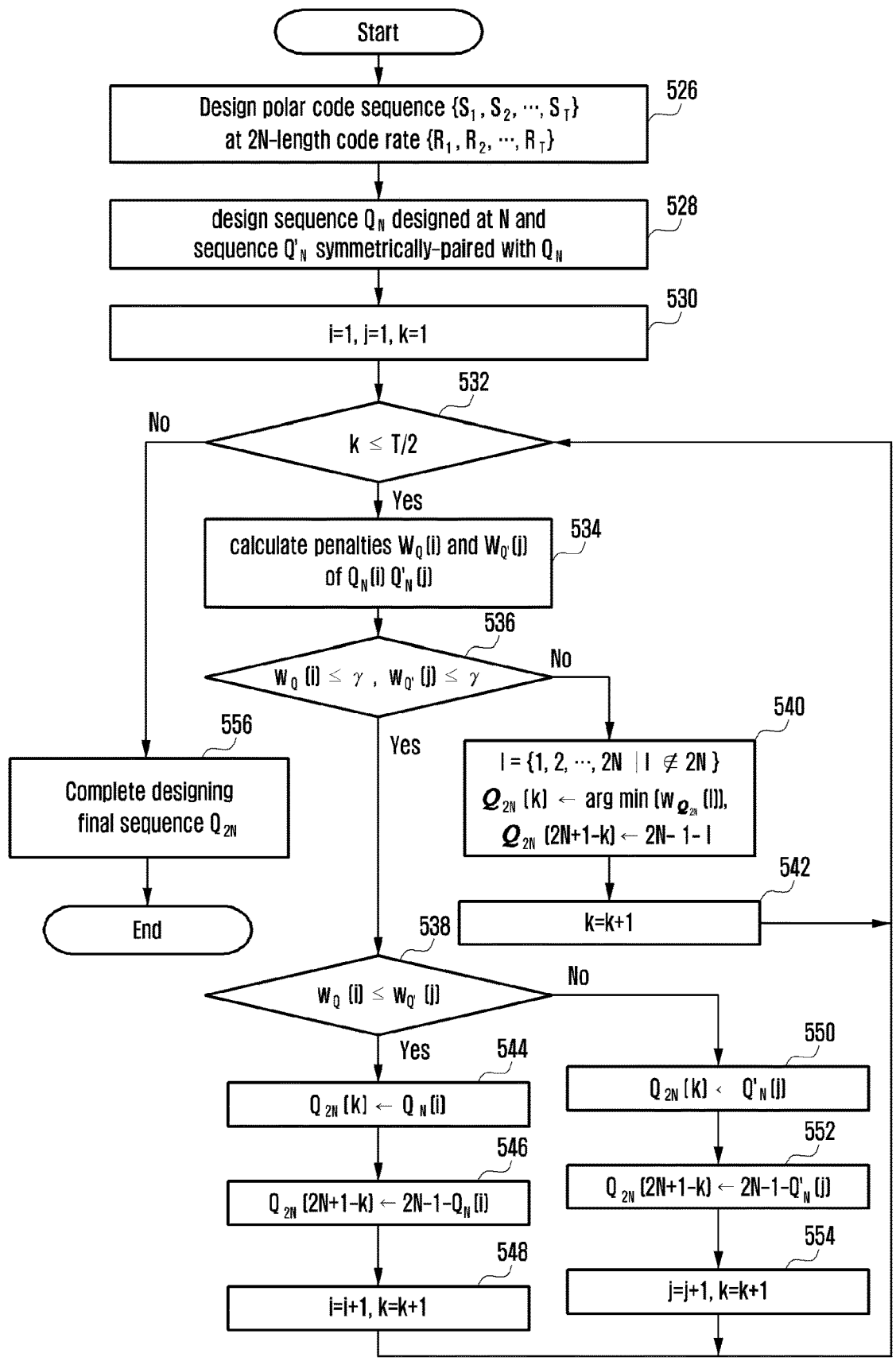
FIG. 5B is a flowchart illustrating a method for designing a sequence according to another disclosed embodiment.

FIG. 5B is a flowchart illustrating a method for designing a sequence according to another disclosed embodiment.

In reference to FIG. 5b, steps 526 to 534 are performed in the same manner as steps 500 to 508 in FIG. 5A.

At step 536, it may be possible to determine whether the penalties of the indices of the two sequences are each greater than $\gamma$. If the penalties of the indices of the two sequences are greater than $\gamma$, the procedure goes to step 540 without maintaining the orders of the indices of the old sequences.

At step 540, it may be possible to calculate penalties of the indices including all other indices and add the index 1 having the least penalty value to the sequence $Q_{2N}(k)$ and the symmetrically-paired index 2N−1−l of the index 1 to sequence $Q_{2N}(2N+1-k)$ to design the final sequence $Q_{2N}$ having a symmetrical structure.

At step 540, it may be possible to increase k by 1, and the procedure goes to step 532.

In the embodiment of FIG. 5B, step 536 of the embodiment of FIG. 5A is added to the design method; as opposed to the above-described sequence generation method in which the index having the least penalty value between the indices of sequences $Q_N$ and $Q_{N'}$ is added to the final sequence $Q_{2N}$ to maintain the order of indices of the old sequences in the final sequence the sequence generation method of the embodiment of FIG. 5B designs the final sequence $Q_{2N}$ to have a symmetrical structure in such a way of, if the two sequences are greater than a predetermined threshold value at step 536, calculating penalties of the indices including other indices and adding the index 1 having the least penalty value to sequence $Q_{2N}(k)$ and the symmetrically-paired index 2N−1−l of the index 1 to sequence $Q_{2N}(2N+1-k)$ at step 540. Afterward, the procedure goes to step 532.

In an embodiment, at least one of the penalty values of the indices selected in sequences $Q_N$ and $Q_{N'}$ is equal to or less than the threshold value $\Upsilon$, and a design method corresponding to the design method described with reference to FIG. 5A is applied to generate a sequence.

The threshold value $\Upsilon$ being applied to the above described design method may be used as a reference point for maintaining the order of indices in the previously designed sequence and vary according to a target error rate. The threshold value $\Upsilon$ may be applied in common to all indices or vary by index; the threshold value $\Upsilon$ may have a role in protecting against structured sequence degradation caused by maintaining the order of indices of the previously generated sequence and keeping an index of which penalty is greater than $\Upsilon$ from being added to the final sequence because the penalty value of each index is a metric indicative of a block error performance degradation occurring by addition of the corresponding index to the final sequence. The $\Upsilon$ may be a preconfigured value or determined based on a structured sequence degradation value corresponding to a specific sequence. The $\Upsilon$ for use in determining an index assigned to a good channel region and the $\Upsilon$ for use in determining an index assigned to a bad channel region may be set to the same value or different values according to the embodiment.

The proposed design method is capable of designing a 2N-length symmetrically-structured sequence $Q_{2N}$ in which the order of indices of index sequence $Q_N$ designed at length N is partially maintained without severe structured sequence degradation according to the sequence.

The proposed method is capable of generating a symmetric sequence that is capable of mitigating structured sequence degradation using the above described threshold value.

Hereinafter, a description is made of the method for generating a partially symmetrically-structured sequence based on a threshold value-based symmetrically-structured sequence design method rather than a wholly symmetrically-structured sequence. A sequence designed by the partially symmetrically-structured sequence design method may include at least part of a previously generated sequence. In an embodiment, the corresponding sequence may have a partially symmetric structure or nearly symmetric structure.

In a disclosed embodiment, the proposed method may generate a sequence having a total length of 1024 that is symmetrically structured as follows.

S1=(1, 2, 3, 5, 9, 17, 4, 33, 6, 7, 10, 65, 11, 18, 13, 19, 129, 21, 34, 35, 5, 37, 8, 66, 257, 67, 41, 12, 69, 14, 20, 49, 130, 15, 73, 131, 22, 513, 23, 36, 26, 133, 81, 38, 27, 39, 137, 258, 29, 42, 68, 259, 97, 43, 70, 145, 261, 50, 45, 71, 51, 74, 265, 75, 161, 53, 132, 514, 16, 82, 77, 515, 134, 273, 83, 57, 135, 24, 517, 138, 193, 85, 28, 139, 98, 40, 289, 99, 30, 521, 146, 89, 141, 260, 44, 147, 31, 101, 262, 46, 63, 529, 149, 72, 266, 52, 162, 321, 105, 47, 267, 163, 76, 54, 153, 78, 274, 269, 165, 516, 545, 113, 58, 84, 275, 79, 518, 194, 385, 195, 169, 290, 277, 136, 519, 59, 86, 197, 522, 291, 87, 140, 61, 100, 577, 177, 281, 523, 90, 142, 102, 91, 293, 148, 530, 525, 201, 322, 143, 103, 531, 150, 93, 106, 264, 297, 151, 323, 107, 164, 32, 209, 533, 641, 546, 154, 268, 325, 166, 155, 114, 547, 109, 537, 305, 270, 167, 115, 276, 271, 386, 48, 225, 549, 157, 329, 170, 387, 278, 196, 117, 171, 56, 279, 198, 578, 520, 389, 337, 80, 178, 769, 553, 579, 292, 282, 173, 199, 60, 121, 524, 179, 581, 393, 283, 294, 202, 88, 526, 295, 203, 62, 181, 5, 353, 532, 561, 527, 298, 92, 63, 642, 585, 210, 205, 324, 534, 401, 299, 104, 144, 643, 211, 94, 535, 185, 326, 306, 301, 548, 538, 327, 645, 593, 108, 213, 152, 95, 307, 330, 550, 539, 226, 110, 417, 156, 331, 227, 116, 309, 551, 168, 649, 111, 541, 554, 770, 217, 388, 338, 580, 609, 555, 333, 771, 229, 158, 390, 339, 313, 118, 172, 272, 582, 657, 159, 391, 119, 394, 174, 280, 562, 449, 557, 122, 773, 233, 583, 341, 180, 563, 200, 586, 395, 354, 175, 355, 587, 123, 777, 284, 345, 182, 565, 204, 402, 397, 296, 644, 673, 241, 286, 403, 183, 206, 357, 125, 300, 186, 528, 594, 589, 646, 287, 595, 212, 207, 569, 302, 405, 647, 785, 187, 536, 361, 418, 214, 650, 328, 308, 597, 303, 215, 419, 189, 540, 705, 651, 610, 64, 409, 310, 228, 332, 218, 421, 552, 611, 369, 311, 542, 658, 772, 801, 601, 653, 219, 230, 334, 556, 659, 96, 314, 543, 613, 774, 450, 340, 231, 335, 425, 558, 775, 661, 451, 112, 221, 315, 234, 342, 392, 584, 564, 778, 674, 617, 235, 559, 343, 396, 453, 317, 833, 160, 779, 675, 120, 433, 588, 566, 665, 356, 346, 398, 242, 237, 567, 786, 590, 781, 677, 625, 176, 358, 457, 124, 347, 404, 570, 596, 787, 591, 706, 243, 399, 359, 406, 349, 681, 571, 648, 598, 126, 707, 789, 362, 245, 897, 407, 363, 802, 652, 599, 573, 709, 288, 184, 612, 803, 127, 465, 208, 188, 602, 410, 420, 411, 422, 370, 654, 793, 689, 365, 249, 481, 304, 190, 216, 805, 713, 834, 191, 312, 220, 809, 835, 721, 544, 776, 660, 336, 232, 371, 655, 603, 614, 603, 615, 423, 837, 817, 560, 898, 222, 413, 841, 737, 316, 452, 426, 373, 223, 662, 618, 128, 780, 663, 236, 318, 899, 427, 377, 454, 344, 676, 619, 666, 626, 782, 319, 434, 238, 429, 455, 621, 678, 901, 568, 667, 849, 400, 348, 244, 435, 239, 458, 788, 783, 627, 679, 669, 360, 459, 437, 592, 905, 350, 246, 865, 192, 708, 572, 629, 682, 466, 790, 408, 351, 247, 461, 441, 633, 683, 791, 710, 804, 913, 574, 364, 250, 467, 600, 690, 794, 685, 575, 251, 412, 482, 711, 929, 366, 469, 691, 795, 806, 372, 424, 224, 253, 367, 483, 714, 656, 414, 473, 604, 807, 693, 797, 715, 616, 961, 415, 374, 320, 485, 836, 606, 810, 722, 428, 717, 697, 375, 811, 607, 664, 489, 838, 240, 378, 620, 723, 456, 818, 813, 430, 738, 379, 436, 431, 497, 839, 725, 900, 668, 819, 842, 622, 739, 784, 352, 381, 729, 628, 623, 821, 460, 843, 680, 741, 248, 902, 438, 670, 850, 671, 630, 439, 825, 462, 845, 684, 442, 792, 252, 903, 468, 576, 463, 745, 851, 631, 906, 634, 866, 368, 443, 753, 853, 907, 712, 686, 635, 867, 796, 254, 692, 470, 416, 445, 687, 637, 808, 255, 471, 484, 914, 376, 857, 474, 716, 909, 798, 694, 869, 608, 915, 799, 486, 475, 695, 718, 930, 873, 812, 917, 432, 380, 698, 487, 477, 724, 719, 699, 840, 490, 931, 814, 382, 881, 921, 726, 624, 491, 701, 820, 815, 440, 383, 962, 933, 727, 498, 464, 493, 672, 740, 844, 963, 822, 730, 499, 937, 823, 731, 742, 632, 444, 846, 501, 904, 965, 826, 852, 743, 733, 446, 472, 256, 847, 945, 688, 636, 505, 447, 827, 746, 969, 854, 908, 829, 747, 638, 855, 696, 868, 476, 800, 977, 639, 754, 749, 910, 858, 755, 720, 488, 916, 478, 911, 870, 859, 700, 757, 871, 479, 384, 492, 816, 993, 861, 918, 702, 874, 728, 761, 919, 932, 875, 494, 922, 882, 703, 824, 500, 495, 877, 732, 934, 923, 883, 935, 502, 744, 848, 448, 925, 964, 885, 938, 734, 503, 828, 939, 966, 506, 889, 748, 735, 856, 830, 640, 831, 507, 946, 750, 941, 967, 912, 480, 509, 860, 756, 751, 947, 970, 872, 971, 949, 862, 758, 978, 920, 704, 863, 973, 759, 953, 876, 496, 762, 979, 763, 924, 994, 878, 981, 765, 884, 936, 879, 504, 995, 926, 736, 985, 927, 886, 997, 940, 832, 887, 508, 1001, 890, 968, 942, 752, 891, 510, 948, 943, 1009, 511, 893, 972, 864, 950, 760, 951, 974, 954, 980, 975, 764, 880, 955, 982, 928, 766, 957, 983, 996, 767, 888, 986, 998, 987, 944, 892, 999, 989, 1002, 512, 1003, 894, 952, 1010, 895, 976, 1005, 1011, 956, 1013, 984, 958, 768, 959, 1017, 988, 1000, 990, 991, 1004, 896, 1006, 1012, 1007, 1014, 960, 1015, 1018, 1019, 992, 1021, 1008, 1016, 1020, 1022, 1023, 1024)

Figure 6A:
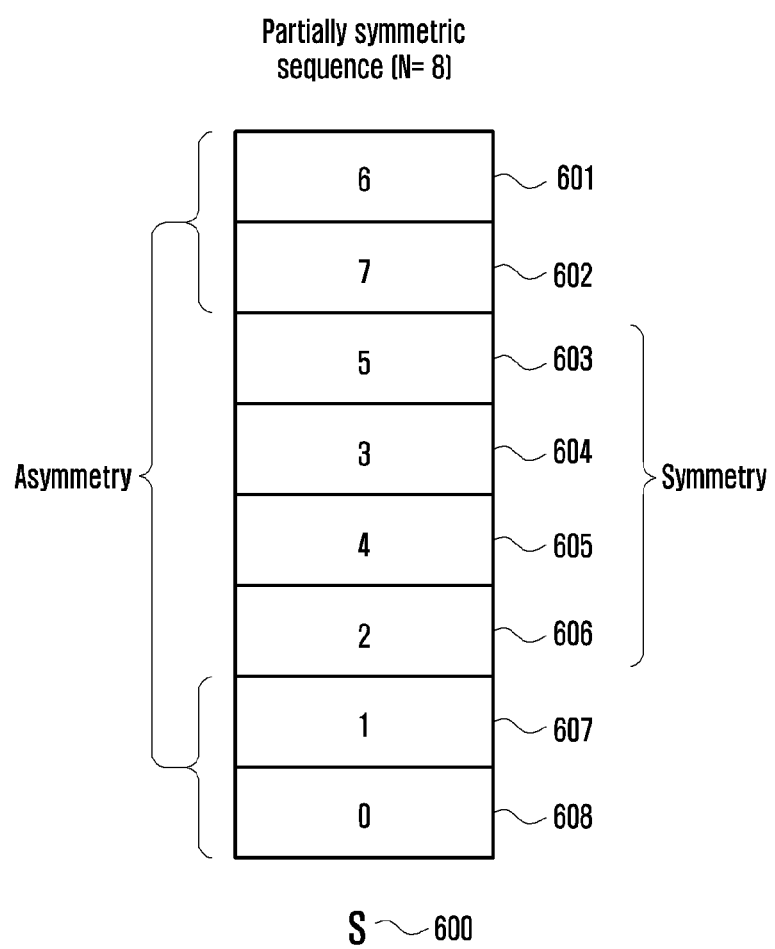
FIG. 6A is a diagram for explaining a partially symmetrically-structured sequence according to a disclosed embodiment.

FIG. 6A is a diagram for explaining a partially symmetrically-structured sequence according to a disclosed embodiment. In FIG. 6A, reference number 600 denotes a partially symmetrically-structured sequence S of bit channel indices in order from the best to worst channels, reference number 601 denotes the first-best channel 6, reference number 602 denotes the second-best channel 7, reference number 603 denotes the third-best channel 5, reference number 604 denotes the fourth-best channel 3, reference number 606 denotes the fifth-best channel 2, reference number 607 denotes the seventh-best channel 1, and reference number 608 denotes the worst channel 0.

Figure 6B:
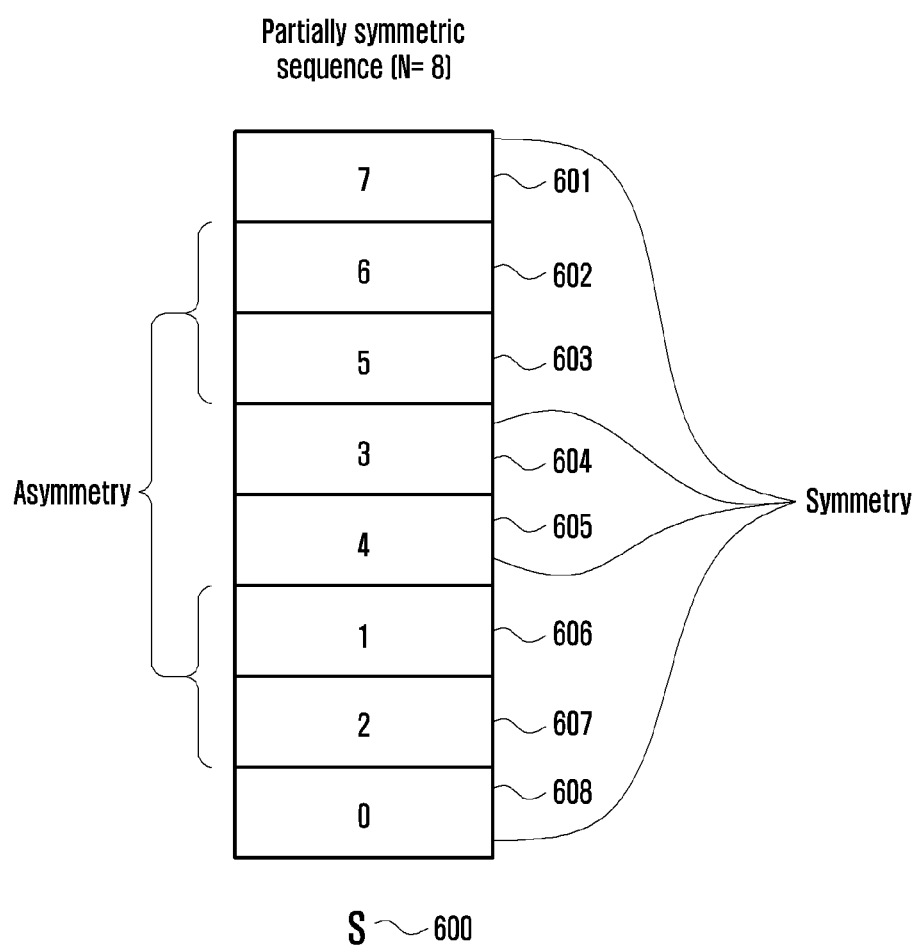
FIG. 6B is a diagram for explaining a partially symmetrically-structured sequence according to another disclosed embodiment.

A partially symmetrically-structured sequence is described with reference to FIG. 6/V A method of designing the sequence is described later with reference to FIG. 7. The partially symmetrically-structured sequence differs from the previously described symmetrically-structured sequence in that a specific part of the sequence is asymmetric. It is shown that $N_{initial}$ best channel indices of the sequence are not symmetrical with $N_{initial}$ worst channel indices of the sequence. A partially symmetrically-structured sequence may be designed to have a low error rate at 2N length in such a way of designing first the $N_{initial}$ best channel indices of the sequence S 190 at various code rates at length N=8 and designing a symmetrically-paired sequence of the sequence of $N_{initial}$ indices with a degree of freedom while maintaining a single index sequence designed at a shorter length, e.g., N=4. The proposed partially symmetrically-structured sequence design method is characterized in that the index sequence in the asymmetrical region is designed in association with the sequence corresponding to the symmetrically-paired indices degree of freedom unlike the above symmetrically-structured sequence design method. As shown in the embodiment, the asymmetrically-structured sequence designed according to the proposed method is characterized in that the best and worst channel regions each including $N_{initial}$ indices at both ends of the sequence are asymmetrical to each other, the asymmetric regions may be located at various symmetric parts in the sequence. That is, the asymmetrically-structured sequence may be located at any location in the symmetrically-structured sequence as shown in FIG. 6B, and the indices located in the asymmetrically-structured sequence may be designed with a degree of freedom. In more detail, the asymmetric sequence is arranged in predetermined regions while the symmetric sequence is ranged in the remaining region as shown in FIG. 6B. The locations of the asymmetric sequence may be fixed or vary according to a configuration; if the locations are changed, it is necessary for the polar coding and decoding devices to store or exchange information on the corresponding locations.

For example, it may be possible to arrange the asymmetric sequences at the locations corresponding to the good channel region and the bad channel region, respectively, and the symmetric sequence therebetween. In this manner, it may be possible to generate a sequence achieving a better structured sequence in a situation where the sequences corresponding to the good and bad channel regions give a severe impact to the entire structured sequence. Locating the symmetric sequence between the regions where the asymmetric sequences are located makes it possible to reduce memory usage by storing just half the symmetric sequence.

In an embodiment, it may be possible to express an asymmetry ratio as $2*N_{initial}/N$, and the symmetrically-structured single sequence reduces the memory usage by 50% by storing N indices of the 2N-length sequence while the partially symmetrically-structured sequence reduces the memory usage by $(50-(100*N_{initial}/N))$ % by storing $N/2+N_{initial}$ indices of the 2N-length sequence. That is, although increasing the memory usage by the ratio of the asymmetric structure in comparison with the symmetrically-structured sequence, the partially symmetrically-structured sequence may be capable of achieving a structured sequence gain in using a short sequence extracted from the finally designed sequence as well as the structured sequence expected with the 2N-length sequence, by granting a degree of freedom to the asymmetrically-structured sequence.

In an embodiment, $N_{initial}$ that determines the ratio of the asymmetric structure in designing the partially symmetrically-structured sequence may be determined by the designer in consideration of a memory complexity reduction degree and target structured sequences at various lengths of sequence and various code rates. For example, $N_{initial}$ may be determined based on a required error rate. In more detail, $N_{initial}$ may be increased when a lower error rate is required. In an embodiment, $N_{initial}$ may also be determined based on the capabilities of the receiver and the transmitter. In an embodiment, $N_{initial}$ may also be configured in consideration of both a target error rate value and a memory capability of the transmitter. For example, $N_{initial}$ may be configured so that the target error rate does not exceed a predetermined value.

The following embodiment is directed to designing a partially symmetrically-structured sequence.

Figure 7A:
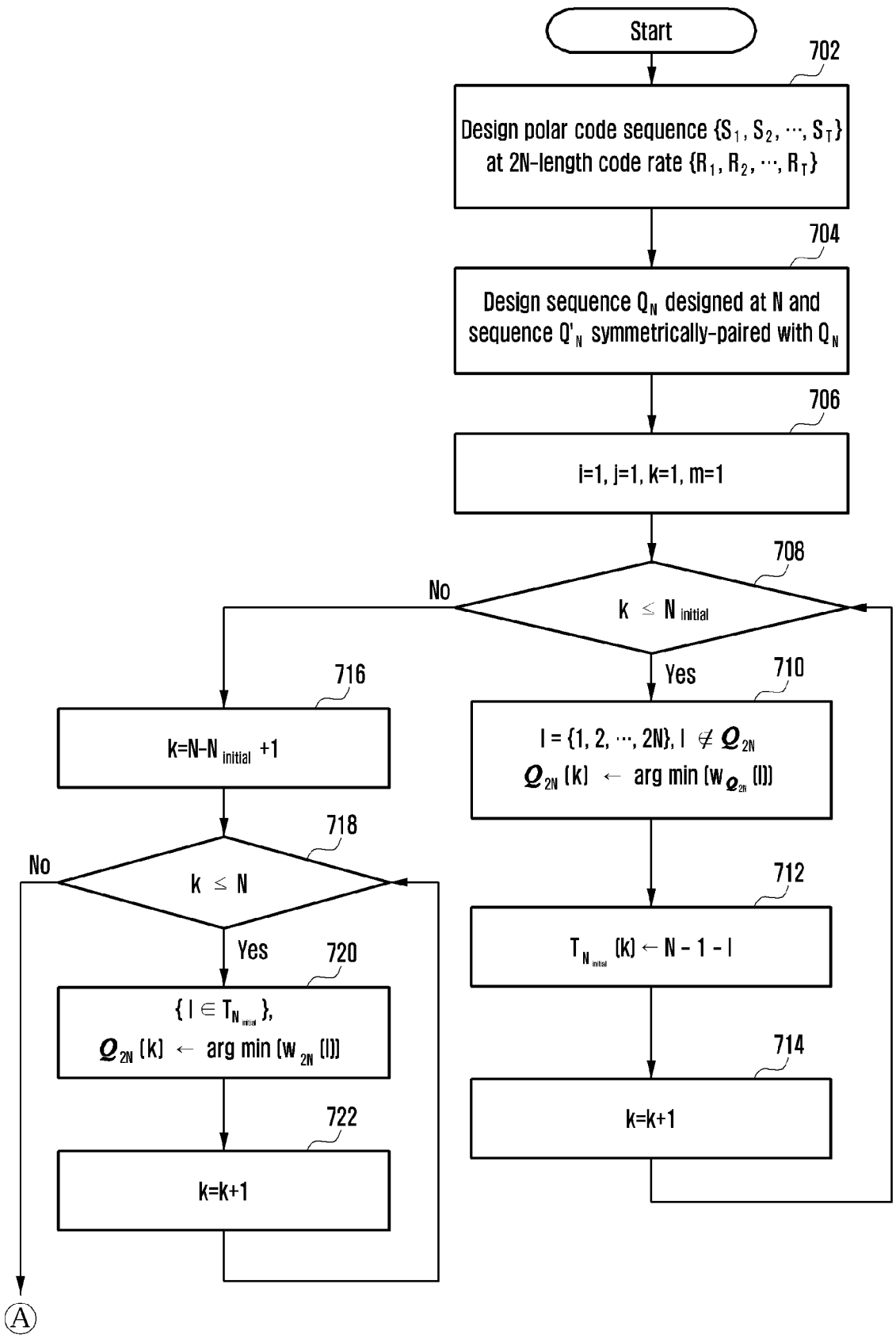
FIGS. 7A and 7B are a flowchart illustrating a method for designing a partially symmetrically-structured sequence according to a disclosed embodiment.
Figure 7B:
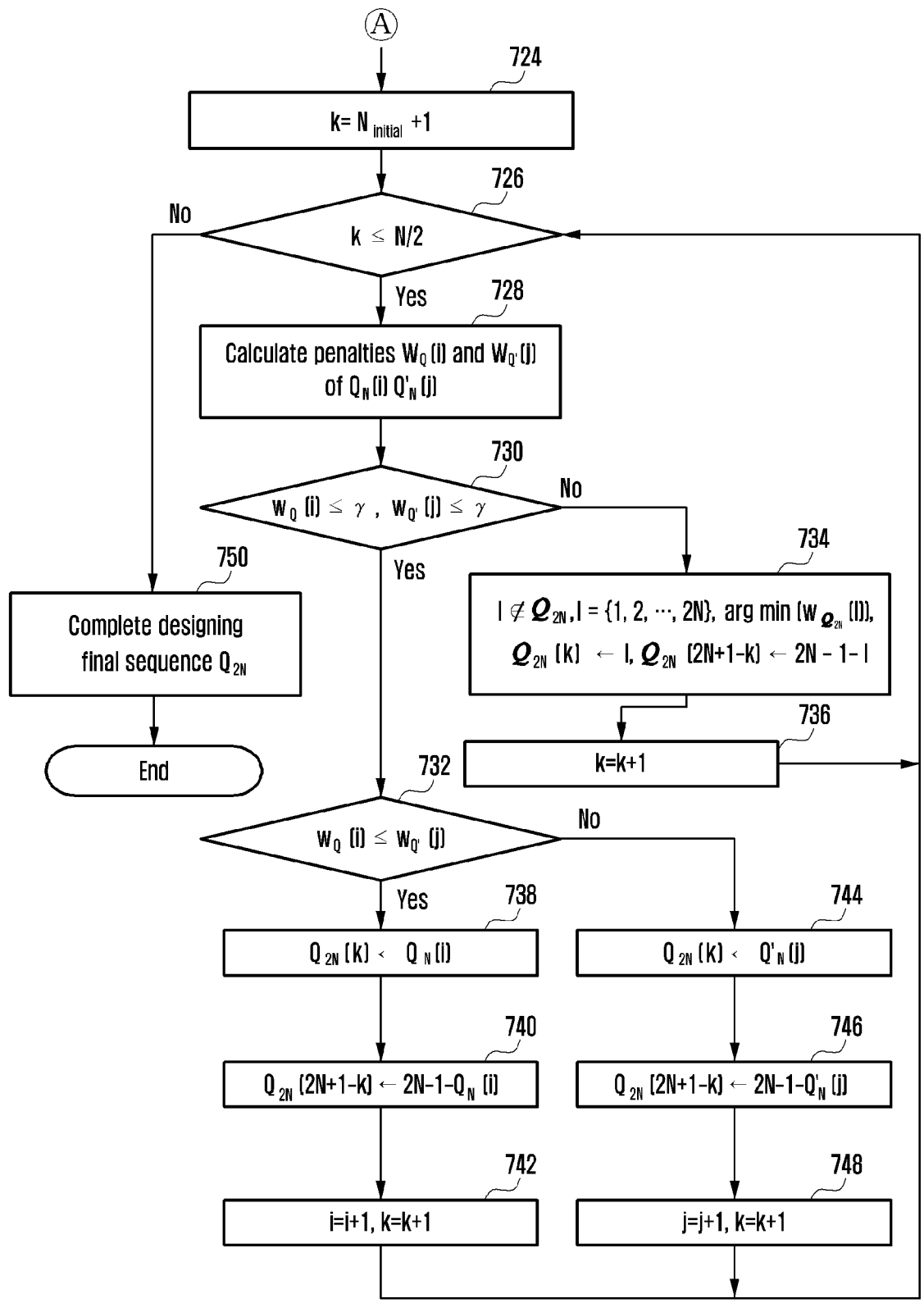

FIGS. 7A and 7B are a flowchart illustrating a method for designing a partially symmetrically-structured sequence according to a disclosed embodiment.

Steps 702 to 706 may be performed in the same manner as steps 500 to 504 of FIG. 5A.

At step 708, it may be possible to compare an index with $N_{initial}$. If the index is equal to or less than $N_{initial}$, it may be possible to add $N_{initial}$ indices to a 2N-length final index sequence $Q_{2N}$ at step 710, the $N_{initial}$ added indices forming an index sequence optimized at each code rate at length 2N.

In this case, it may be possible to store, at step 712, symmetrically-paired indices in a temporal sequence $T_{N\_initial}$ having a length of $N_{initial}$ before adding the symmetrically-paired indices to the symmetrical location in the final sequence, unlike the symmetrically-structured sequence design method. Afterward, it may be possible to design a sequence of $N_{initial}$ indices to be added, by repeating steps 718 to 724, to the symmetrical locations of the $N_{initial}$ indices designed previously to be added at the top of the final sequence $Q_{2N}$. Here, the index sequence is designed such that severe structured sequence degradation does not occur with the finally-designed 2N-length sequence $Q_{2N}$ while maintaining the index sequence of the previously designed N-length index sequence $Q_N$.

In the case where designing an index sequence at a symmetric location to the $Q_{2N}(N)$ location is completed along with designing $N_{initial}$ worst channels of $Q_{2N}$, it may be possible to design a single index sequence with the same method as that for designing the symmetrically-structured sequence from a location with the exception of $N_{initial}$ best channels in the sequence $Q_{2N}$. This may be performed at steps 724 to 750, although the description is directed to the use of the design method of FIG. 5B in the disclosed embodiment, it may be possible to design the symmetrically-structured sequence region using the method of FIG. 5A. In the case of designing a partially symmetrically structured sequence according to the embodiment of FIGS. 7A and 7B, the comparison operation at step 708 may be performed differently according to the location of the asymmetric sequence. The order of designing the asymmetric sequence and symmetric sequence may vary according to an embodiment. It may also be possible to design a sequence for the best channel region and then proceed to design a sequence for the other region.

The proposed design method produces an asymmetric structure of the best and worst channel regions each having $N_{initial}$ indices and a symmetric structure therebetween in $Q_{2N}$. The 2N-length sequence $Q_{2N}$ designed according to the proposed design method makes it possible to store the index sequence corresponding to halves of the asymmetrically structured sequence and the symmetrically-structured sequence rather than the whole 2N-length index sequence for use of the 2N-length index sequence. That is, it may be possible to store best channel indices of the sequence $Q_{2N}$, $(N-2*N_{initial})/2$ indices as half the symmetric structure following the $N_{initial}$ best channel indices and $N_{initial}$ worst channel indices of the sequence $Q_{2N}$ for use, thereby reducing memory complexity by $(50-(100*N_{initial})/N)$ % in comparison with storing the 2N-length sequence.

In a disclosed embodiment, the proposed method may generate a sequence S2 having a partially asymmetrical structure of which $N_{initial}$ is 50 as follows.

S2=(1, 2, 3, 5, 9, 17, 33, 4, 65, 6, 7, 129, 10, 257, 11, 18, 13, 513, 19, 34, 21, 35, 25, 66, 37, 67, 8, 41, 130, 69, 12, 49, 131, 73, 258, 133, 14, 81, 20, 15, 137, 22, 23, 36, 26, 38, 27, 39, 29, 42, 68, 259, 97, 43, 70, 50, 145, 261, 45, 71, 74, 51, 16, 132, 265, 75, 161, 514, 53, 134, 24, 77, 515, 83, 135, 273, 57, 28, 138, 517, 40, 85, 193, 98, 139, 30, 260, 44, 99, 289, 146, 521, 31, 141, 89, 262, 147, 46, 101, 72, 52, 263, 47, 149, 529, 266, 162, 76, 105, 321, 54, 267, 163, 78, 55, 153, 516, 274, 58, 84, 269, 165, 79, 545, 113, 136, 275, 518, 194, 59, 86, 140, 169, 519, 385, 195, 290, 277, 87, 522, 100, 61, 90, 197, 291, 142, 102, 577, 523, 177, 281, 148, 91, 143, 103, 530, 293, 150, 525, 201, 264, 322, 32, 106, 531, 93, 151, 323, 164, 107, 268, 154, 297, 209, 533, 48, 166, 641, 546, 114, 155, 270, 109, 325, 276, 547, 167, 115, 271, 56, 305, 537, 157, 386, 170, 196, 278, 225, 80, 549, 329, 117, 387, 171, 520, 60, 279, 578, 198, 292, 282, 178, 88, 389, 173, 337, 199, 769, 553, 579, 524, 62, 121, 294, 179, 283, 202, 92, 63, 581, 526, 295, 393, 203, 144, 532, 181, 104, 285, 561, 527, 298, 94, 353, 324, 210, 642, 205, 299, 585, 534, 152, 108, 326, 401, 211, 643, 535, 95, 185, 306, 548, 301, 538, 327, 156, 110, 213, 307, 330, 645, 116, 593, 550, 539, 226, 168, 111, 158, 331, 272, 227, 388, 551, 417, 309, 118, 217, 649, 541, 554, 172, 159, 770, 338, 580, 333, 390, 229, 119, 280, 609, 555, 174, 339, 771, 313, 391, 582, 122, 200, 180, 394, 284, 175, 657, 562, 557, 233, 449, 341, 773, 583, 123, 354, 563, 586, 395, 204, 182, 296, 286, 355, 206, 183, 402, 125, 587, 300, 397, 345, 287, 777, 565, 644, 241, 673, 528, 186, 212, 403, 594, 357, 64, 589, 646, 207, 302, 187, 214, 328, 308, 595, 569, 647, 536, 405, 303, 418, 785, 215, 650, 361, 332, 228, 96, 310, 189, 597, 540, 218, 419, 409, 334, 705, 651, 610, 552, 311, 230, 219, 542, 611, 421, 658, 772, 112, 369, 314, 340, 335, 231, 801, 601, 653, 556, 392, 450, 543, 659, 613, 774, 315, 558, 234, 160, 221, 120, 451, 425, 342, 775, 396, 235, 343, 661, 584, 564, 778, 317, 453, 674, 356, 617, 559, 346, 398, 242, 176, 588, 237, 433, 124, 833, 779, 675, 566, 358, 665, 347, 567, 404, 399, 243, 126, 457, 786, 590, 359, 781, 677, 625, 570, 596, 406, 349, 288, 184, 787, 591, 362, 245, 706, 407, 127, 208, 648, 363, 420, 571, 410, 465, 188, 681, 598, 707, 789, 422, 897, 802, 652, 599, 573, 370, 411, 365, 249, 304, 216, 190, 709, 612, 803, 602, 654, 793, 220, 312, 689, 191, 481, 544, 834, 336, 713, 805, 232, 371, 423, 222, 413, 316, 835, 809, 721, 776, 660, 614, 655, 452, 426, 373, 223, 128, 603, 236, 318, 427, 344, 837, 560, 615, 454, 605, 662, 377, 817, 898, 618, 319, 780, 663, 434, 238, 841, 737, 676, 619, 429, 455, 400, 348, 244, 666, 435, 239, 568, 899, 782, 626, 621, 458, 678, 360, 667, 459, 350, 246, 192, 901, 592, 788, 437, 849, 783, 627, 679, 466, 408, 669, 351, 572, 708, 247, 461, 441, 364, 682, 790, 629, 250, 683, 600, 574, 905, 804, 865, 791, 467, 710, 251, 412, 366, 482, 575, 633, 469, 372, 424, 224, 794, 690, 685, 711, 656, 913, 253, 367, 604, 414, 483, 806, 795, 714, 473, 415, 374, 320, 691, 616, 606, 807, 485, 428, 836, 715, 929, 797, 693, 664, 375, 810, 240, 607, 722, 620, 489, 378, 456, 430, 717, 697, 811, 838, 723, 818, 379, 436, 961, 668, 431, 622, 813, 839, 497, 352, 784, 381, 460, 248, 738, 680, 628, 725, 438, 900, 623, 842, 819, 670, 739, 729, 843, 821, 630, 439, 462, 671, 902, 442, 252, 684, 576, 792, 468, 463, 368, 850, 741, 631, 845, 825, 903, 443, 634, 712, 254, 686, 851, 470, 416, 745, 906, 796, 635, 692, 445, 687, 255, 866, 853, 471, 484, 376, 808, 907, 716, 608, 474, 637, 798, 753, 694, 867, 914, 857, 799, 486, 475, 432, 909, 380, 695, 718, 812, 915, 869, 698, 487, 724, 477, 719, 840, 930, 490, 382, 814, 624, 699, 917, 873, 491, 440, 726, 820, 383, 815, 701, 672, 931, 727, 498, 464, 740, 921, 844, 493, 881, 822, 632, 730, 499, 444, 962, 933, 823, 742, 846, 731, 904, 963, 501, 446, 472, 256, 826, 688, 852, 636, 937, 847, 743, 733, 827, 447, 746, 965, 505, 854, 638, 908, 696, 476, 945, 800, 747, 829, 855, 639, 868, 488, 720, 969, 754, 910, 858, 478, 749, 700, 916, 755, 870, 911, 479, 384, 859, 977, 492, 816, 728, 871, 757, 918, 861, 702, 874, 932, 494, 919, 993, 703, 761, 824, 500, 875, 732, 495, 922, 882, 934, 877, 744, 848, 502, 448, 923, 883, 734, 828, 935, 964, 925, 503, 938, 748, 735, 830, 640, 506, 856, 885, 939, 966, 831, 507, 750, 889, 912, 480, 946, 860, 756, 941, 967, 751, 509, 872, 970, 947, 862, 758, 971, 704, 920, 949, 863, 759, 496, 876, 978, 762, 973, 953, 924, 979, 878, 763, 936, 884, 994, 504, 879, 736, 926, 981, 765, 995, 886, 927, 832, 940, 985, 508, 887, 997, 968, 752, 890, 942, 510, 948, 1001, 891, 943, 972, 511, 864, 950, 760, 893, 1009, 974, 951, 954, 980, 764, 880, 975, 955, 982, 928, 766, 957, 767, 888, 996, 983, 986, 998, 944, 987, 892, 512, 999, 989, 1002, 894, 952, 895, 1003, 976, 1010, 956, 1005, 1011, 984, 958, 768, 1013, 959, 988, 1017, 1000, 990, 991, 896, 1004, 1006, 1012, 1007, 960, 1014, 1015, 1018, 1019, 992, 1021, 1008, 1016, 1020, 1022, 1023, 1024)

In a disclosed embodiment, the proposed method may generate a sequence S3 having a partially asymmetrical structure of which $N_{initial}$ is 100 as follows.

S3=(1, 2, 3, 5, 9, 17, 33, 4, 65, 6, 7, 129, 10, 257, 11, 18, 13, 513, 19, 34, 21, 35, 25, 66, 37, 67, 8, 41, 130, 69, 12, 49, 131, 73, 258, 133, 14, 81, 20, 15, 259, 137, 22, 97, 261, 145, 23, 36, 26, 514, 265, 161, 38, 27, 515, 273, 39, 29, 68, 193, 42, 517, 289, 43, 70, 50, 16, 45, 71, 132, 521, 74, 51, 75, 53, 134, 24, 82, 77, 57, 135, 83, 260, 138, 28, 98, 85, 139, 262, 40, 30, 99, 146, 89, 141, 31, 44, 101, 147, 46, 72, 52, 263, 47, 149, 529, 266, 162, 76, 105, 321, 54, 267, 163, 78, 55, 153, 516, 274, 58, 84, 269, 165, 79, 545, 113, 136, 275, 518, 194, 59, 86, 140, 169, 519, 385, 195, 290, 277, 87, 522, 100, 61, 90, 197, 291, 142, 102, 577, 523, 177, 281, 148, 91, 143, 103, 530, 293, 150, 525, 201, 264, 322, 32, 106, 531, 93, 151, 323, 164, 107, 268, 154, 297, 209, 533, 48, 166, 641, 546, 114, 155, 270, 109, 325, 276, 547, 167, 115, 271, 56, 305, 537, 157, 386, 170, 196, 278, 225, 80, 549, 329, 117, 387, 171, 520, 60, 279, 578, 198, 292, 282, 178, 88, 389, 173, 337, 199, 769, 553, 579, 524, 62, 121, 294, 179, 283, 202, 92, 63, 581, 526, 295, 393, 203, 144, 532, 181, 104, 285, 561, 527, 298, 94, 353, 324, 210, 642, 205, 299, 585, 534, 152, 108, 326, 401, 211, 643, 535, 95, 185, 306, 548, 301, 538, 327, 156, 110, 213, 307, 330, 645, 116, 593, 550, 539, 226, 168, 111, 158, 331, 272, 227, 388, 551, 417, 309, 118, 217, 649, 541, 554, 172, 159, 770, 338, 580, 333, 390, 229, 119, 280, 609, 555, 174, 339, 771, 313, 391, 582, 122, 200, 180, 394, 284, 175, 657, 562, 557, 233, 449, 341, 773, 583, 123, 354, 563, 586, 395, 204, 182, 296, 286, 355, 206, 183, 402, 125, 587, 300, 397, 345, 287, 777, 565, 644, 241, 673, 528, 186, 212, 403, 594, 357, 64, 589, 646, 207, 302, 187, 214, 328, 308, 595, 569, 647, 536, 405, 303, 418, 785, 215, 650, 361, 332, 228, 96, 310, 189, 597, 540, 218, 419, 409, 334, 705, 651, 610, 552, 311, 230, 219, 542, 611, 421, 658, 772, 112, 369, 314, 340, 335, 231, 801, 601, 653, 556, 392, 450, 543, 659, 613, 774, 315, 558, 234, 160, 221, 120, 451, 425, 342, 775, 396, 235, 343, 661, 584, 564, 778, 317, 453, 674, 356, 617, 559, 346, 398, 242, 176, 588, 237, 433, 124, 833, 779, 675, 566, 358, 665, 347, 567, 404, 399, 243, 126, 457, 786, 590, 359, 781, 677, 625, 570, 596, 406, 349, 288, 184, 787, 591, 362, 245, 706, 407, 127, 208, 648, 363, 420, 571, 410, 465, 188, 681, 598, 707, 789, 422, 897, 802, 652, 599, 573, 370, 411, 365, 249, 304, 216, 190, 709, 612, 803, 602, 654, 793, 220, 312, 689, 191, 481, 544, 834, 336, 713, 805, 232, 371, 423, 222, 413, 316, 835, 809, 721, 776, 660, 614, 655, 452, 426, 373, 223, 128, 603, 236, 318, 427, 344, 837, 560, 615, 454, 605, 662, 377, 817, 898, 618, 319, 780, 663, 434, 238, 841, 737, 676, 619, 429, 455, 400, 348, 244, 666, 435, 239, 568, 899, 782, 626, 621, 458, 678, 360, 667, 459, 350, 246, 192, 901, 592, 788, 437, 849, 783, 627, 679, 466, 408, 669, 351, 572, 708, 247, 461, 441, 364, 682, 790, 629, 250, 683, 600, 574, 905, 804, 865, 791, 467, 710, 251, 412, 366, 482, 575, 633, 469, 372, 424, 224, 794, 690, 685, 711, 656, 913, 253, 367, 604, 414, 483, 806, 795, 714, 473, 415, 374, 320, 691, 616, 606, 807, 485, 428, 836, 715, 929, 797, 693, 664, 375, 810, 240, 607, 722, 620, 489, 378, 456, 430, 717, 697, 811, 838, 723, 818, 379, 436, 961, 668, 431, 622, 813, 839, 497, 352, 784, 381, 460, 248, 738, 680, 628, 725, 438, 900, 623, 842, 819, 670, 739, 729, 843, 821, 630, 439, 462, 671, 902, 442, 252, 684, 576, 792, 468, 463, 368, 850, 741, 631, 845, 825, 903, 443, 634, 712, 254, 686, 851, 470, 416, 745, 906, 796, 635, 692, 445, 687, 255, 866, 853, 471, 484, 376, 808, 907, 716, 608, 474, 637, 798, 753, 694, 867, 914, 857, 799, 486, 475, 432, 909, 380, 695, 718, 812, 915, 869, 698, 487, 724, 477, 719, 840, 930, 490, 382, 814, 624, 699, 917, 873, 491, 440, 726, 820, 383, 815, 701, 672, 931, 727, 498, 464, 740, 921, 844, 493, 881, 822, 632, 730, 499, 444, 962, 933, 823, 742, 846, 731, 904, 963, 501, 446, 472, 256, 826, 688, 852, 636, 937, 847, 743, 733, 827, 447, 746, 965, 505, 854, 638, 908, 696, 476, 945, 800, 747, 829, 855, 639, 868, 488, 720, 969, 754, 910, 858, 478, 749, 700, 916, 755, 870, 911, 479, 384, 859, 977, 492, 816, 728, 871, 757, 918, 861, 702, 874, 932, 494, 919, 993, 703, 761, 824, 500, 875, 732, 495, 922, 882, 934, 877, 744, 848, 502, 448, 923, 883, 734, 828, 935, 964, 925, 503, 938, 748, 735, 830, 640, 506, 856, 885, 939, 966, 831, 507, 750, 889, 912, 480, 946, 860, 756, 941, 967, 751, 509, 872, 970, 947, 862, 758, 971, 704, 920, 949, 863, 759, 496, 876, 978, 762, 973, 953, 924, 979, 878, 763, 504, 936, 736, 884, 994, 879, 926, 981, 765, 995, 832, 886, 927, 508, 940, 985, 887, 752, 997, 968, 890, 942, 510, 948, 1001, 891, 943, 511, 864, 972, 760, 950, 893, 1009, 974, 951, 764, 954, 980, 880, 975, 955, 928, 766, 982, 957, 767, 888, 996, 983, 986, 998, 944, 987, 892, 512, 999, 989, 1002, 894, 952, 895, 1003, 976, 1010, 956, 1005, 1011, 984, 958, 768, 1013, 959, 988, 1017, 1000, 990, 991, 896, 1004, 1006, 1012, 1007, 960, 1014, 1015, 1018, 1019, 992, 1021, 1008, 1016, 1020, 1022, 1023, 1024)

In a disclosed embodiment, the proposed method may generate a sequence S4 having a partially asymmetrical structure of which $N_{initial}$ is 128 as follows.

S4=(1, 2, 3, 5, 9, 17, 33, 4, 65, 6, 7, 129, 10, 257, 11, 18, 13, 513, 19, 34, 21, 35, 25, 66, 37, 67, 8, 41, 130, 69, 12, 49, 131, 73, 258, 133, 14, 81, 20, 15, 259, 137, 22, 97, 261, 145, 23, 36, 26, 514, 265, 161, 38, 27, 515, 273, 39, 29, 68, 193, 42, 517, 289, 43, 70, 50, 16, 45, 71, 132, 521, 74, 51, 321, 75, 53, 134, 24, 529, 82, 77, 57, 135, 83, 260, 138, 28, 545, 98, 85, 139, 262, 40, 30, 99, 146, 89, 141, 263, 31, 44, 101, 147, 266, 516, 162, 149, 72, 46, 105, 267, 163, 52, 47, 153, 274, 113, 269, 76, 165, 275, 54, 55, 78, 136, 58, 84, 79, 518, 194, 59, 86, 140, 169, 519, 385, 195, 290, 277, 87, 522, 100, 61, 90, 197, 291, 142, 102, 577, 523, 177, 281, 148, 91, 143, 103, 530, 293, 150, 525, 201, 264, 322, 32, 106, 531, 93, 151, 323, 164, 107, 268, 154, 297, 209, 533, 48, 166, 641, 546, 114, 155, 270, 109, 325, 276, 547, 167, 115, 271, 56, 305, 537, 157, 386, 170, 196, 278, 225, 80, 549, 329, 117, 387, 171, 520, 60, 279, 578, 198, 292, 282, 178, 88, 389, 173, 337, 199, 769, 553, 579, 524, 62, 121, 294, 179, 283, 202, 92, 63, 581, 526, 295, 393, 203, 144, 532, 181, 104, 285, 561, 527, 298, 94, 353, 324, 210, 642, 205, 299, 585, 534, 152, 108, 326, 401, 211, 643, 535, 95, 185, 306, 548, 301, 538, 327, 156, 110, 213, 307, 330, 645, 116, 593, 550, 539, 226, 168, 111, 158, 331, 272, 227, 388, 551, 417, 309, 118, 217, 649, 541, 554, 172, 159, 770, 338, 580, 333, 390, 229, 119, 280, 609, 555, 174, 339, 771, 313, 391, 582, 122, 200, 180, 394, 284, 175, 657, 562, 557, 233, 449, 341, 773, 583, 123, 354, 563, 586, 395, 204, 182, 296, 286, 355, 206, 183, 402, 125, 587, 300, 397, 345, 287, 777, 565, 644, 241, 673, 528, 186, 212, 403, 594, 357, 64, 589, 646, 207, 302, 187, 214, 328, 308, 595, 569, 647, 536, 405, 303, 418, 785, 215, 650, 361, 332, 228, 96, 310, 189, 597, 540, 218, 419, 409, 334, 705, 651, 610, 552, 311, 230, 219, 542, 611, 421, 658, 772, 112, 369, 314, 340, 335, 231, 801, 601, 653, 556, 392, 450, 543, 659, 613, 774, 315, 558, 234, 160, 221, 120, 451, 425, 342, 775, 396, 235, 343, 661, 584, 564, 778, 317, 453, 674, 356, 617, 559, 346, 398, 242, 176, 588, 237, 433, 124, 833, 779, 675, 566, 358, 665, 347, 567, 404, 399, 243, 126, 457, 786, 590, 359, 781, 677, 625, 570, 596, 406, 349, 288, 184, 787, 591, 362, 245, 706, 407, 127, 208, 648, 363, 420, 571, 410, 465, 188, 681, 598, 707, 789, 422, 897, 802, 652, 599, 573, 370, 411, 365, 249, 304, 216, 190, 709, 612, 803, 602, 654, 793, 220, 312, 689, 191, 481, 544, 834, 336, 713, 805, 232, 371, 423, 222, 413, 316, 835, 809, 721, 776, 660, 614, 655, 452, 426, 373, 223, 128, 603, 236, 318, 427, 344, 837, 560, 615, 454, 605, 662, 377, 817, 898, 618, 319, 780, 663, 434, 238, 841, 737, 676, 619, 429, 455, 400, 348, 244, 666, 435, 239, 568, 899, 782, 626, 621, 458, 678, 360, 667, 459, 350, 246, 192, 901, 592, 788, 437, 849, 783, 627, 679, 466, 408, 669, 351, 572, 708, 247, 461, 441, 364, 682, 790, 629, 250, 683, 600, 574, 905, 804, 865, 791, 467, 710, 251, 412, 366, 482, 575, 633, 469, 372, 424, 224, 794, 690, 685, 711, 656, 913, 253, 367, 604, 414, 483, 806, 795, 714, 473, 415, 374, 320, 691, 616, 606, 807, 485, 428, 836, 715, 929, 797, 693, 664, 375, 810, 240, 607, 722, 620, 489, 378, 456, 430, 717, 697, 811, 838, 723, 818, 379, 436, 961, 668, 431, 622, 813, 839, 497, 352, 784, 381, 460, 248, 738, 680, 628, 725, 438, 900, 623, 842, 819, 670, 739, 729, 843, 821, 630, 439, 462, 671, 902, 442, 252, 684, 576, 792, 468, 463, 368, 850, 741, 631, 845, 825, 903, 443, 634, 712, 254, 686, 851, 470, 416, 745, 906, 796, 635, 692, 445, 687, 255, 866, 853, 471, 484, 376, 808, 907, 716, 608, 474, 637, 798, 753, 694, 867, 914, 857, 799, 486, 475, 432, 909, 380, 695, 718, 812, 915, 869, 698, 487, 724, 477, 719, 840, 930, 490, 382, 814, 624, 699, 917, 873, 491, 440, 726, 820, 383, 815, 701, 672, 931, 727, 498, 464, 740, 921, 844, 493, 881, 822, 632, 730, 499, 444, 962, 933, 823, 742, 846, 731, 904, 963, 501, 446, 472, 256, 826, 688, 852, 636, 937, 847, 743, 733, 827, 447, 746, 965, 505, 854, 638, 908, 696, 476, 945, 800, 747, 829, 855, 639, 868, 488, 720, 969, 754, 910, 858, 478, 749, 700, 916, 755, 870, 911, 479, 384, 859, 977, 492, 816, 728, 871, 757, 918, 861, 702, 874, 932, 494, 919, 993, 703, 761, 824, 500, 875, 732, 495, 922, 882, 934, 877, 744, 848, 502, 448, 923, 883, 734, 828, 935, 964, 925, 503, 938, 748, 735, 830, 640, 506, 856, 885, 939, 966, 831, 507, 480, 750, 889, 912, 946, 860, 509, 756, 941, 967, 751, 872, 970, 947, 862, 704, 758, 971, 920, 496, 949, 863, 759, 876, 978, 762, 973, 953, 924, 979, 878, 763, 504, 936, 736, 884, 994, 879, 926, 981, 765, 995, 832, 886, 927, 508, 940, 985, 887, 752, 997, 968, 890, 942, 510, 948, 1001, 891, 943, 511, 864, 972, 760, 950, 893, 1009, 974, 951, 764, 954, 980, 880, 975, 955, 928, 766, 982, 957, 767, 888, 996, 983, 986, 998, 944, 987, 892, 512, 999, 989, 1002, 894, 952, 895, 1003, 976, 1010, 956, 1005, 1011, 984, 958, 768, 1013, 959, 988, 1017, 1000, 990, 991, 896, 1004, 1006, 1012, 1007, 960, 1014, 1015, 1018, 1019, 992, 1021, 1008, 1016, 1020, 1022, 1023, 1024)

In a disclosed embodiment, the proposed method may generate a sequence $S_5$ having a partially asymmetrical structure of which $N_{initial}$ is 150 as follows.

S5=(1, 2, 3, 5, 9, 17, 33, 4, 65, 6, 7, 129, 10, 257, 11, 18, 13, 513, 19, 34, 21, 35, 25, 66, 3, 67, 8, 41, 130, 69, 12, 49, 131, 73, 258, 133, 14, 81, 20, 15, 259, 137, 22, 97, 261, 145, 23, 36, 26, 514, 265, 161, 38, 27, 515, 273, 39, 29, 68, 193, 42, 517, 289, 43, 70, 50, 16, 45, 71, 132, 521, 74, 51, 321, 75, 53, 385, 134, 24, 529, 82, 77, 57, 135, 83, 260, 138, 28, 545, 98, 85, 139, 262, 40, 30, 99, 146, 89, 141, 263, 31, 44, 101, 147, 266, 516, 162, 149, 72, 46, 105, 267, 163, 52, 47, 518, 153, 274, 113, 269, 194, 76, 165, 275, 54, 519, 195, 169, 290, 277, 55, 78, 136, 522, 58, 84, 79, 197, 291, 59, 86, 140, 61, 87, 100, 142, 90, 148, 102, 91, 577, 523, 177, 281, 143, 103, 530, 293, 150, 525, 201, 264, 322, 32, 106, 531, 93, 151, 323, 164, 107, 268, 154, 297, 209, 533, 48, 166, 641, 546, 114, 155, 270, 109, 325, 276, 547, 167, 115, 271, 56, 305, 537, 157, 386, 170, 196, 278, 225, 80, 549, 329, 117, 387, 171, 520, 60, 279, 578, 198, 292, 282, 178, 88, 389, 173, 337, 199, 769, 553, 579, 524, 62, 121, 294, 179, 283, 202, 92, 63, 581, 526, 295, 393, 203, 144, 532, 181, 104, 285, 561, 527, 298, 94, 353, 324, 210, 642, 205, 299, 585, 534, 152, 108, 326, 401, 211, 643, 535, 95, 185, 306, 548, 301, 538, 327, 156, 110, 213, 307, 330, 645, 116, 593, 550, 539, 226, 168, 111, 158, 331, 272, 227, 388, 551, 417, 309, 118, 217, 649, 541, 554, 172, 159, 770, 338, 580, 333, 390, 229, 119, 280, 609, 555, 174, 339, 771, 313, 391, 582, 122, 200, 180, 394, 284, 175, 657, 562, 557, 233, 449, 341, 773, 583, 123, 354, 563, 586, 395, 204, 182, 296, 286, 355, 206, 183, 402, 125, 587, 300, 397, 345, 287, 777, 565, 644, 241, 673, 528, 186, 212, 403, 594, 357, 64, 589, 646, 207, 302, 187, 214, 328, 308, 595, 569, 647, 536, 405, 303, 418, 785, 215, 650, 361, 332, 228, 96, 310, 189, 597, 540, 218, 419, 409, 334, 705, 651, 610, 552, 311, 230, 219, 542, 611, 421, 658, 772, 112, 369, 314, 340, 335, 231, 801, 601, 653, 556, 392, 450, 543, 659, 613, 774, 315, 558, 234, 160, 221, 120, 451, 425, 342, 775, 396, 235, 343, 661, 584, 564, 778, 317, 453, 674, 356, 617, 559, 346, 398, 242, 176, 588, 237, 433, 124, 833, 779, 675, 566, 358, 665, 347, 567, 404, 399, 243, 126, 457, 786, 590, 359, 781, 677, 625, 570, 596, 406, 349, 288, 184, 787, 591, 362, 245, 706, 407, 127, 208, 648, 363, 420, 571, 410, 465, 188, 681, 598, 707, 789, 422, 897, 802, 652, 599, 573, 370, 411, 365, 249, 304, 216, 190, 709, 612, 803, 602, 654, 793, 220, 312, 689, 191, 481, 544, 834, 336, 713, 805, 232, 371, 423, 222, 413, 316, 835, 809, 721, 776, 660, 614, 655, 452, 426, 373, 223, 128, 603, 236, 318, 427, 344, 837, 560, 615, 454, 605, 662, 377, 817, 898, 618, 319, 780, 663, 434, 238, 841, 737, 676, 619, 429, 455, 400, 348, 244, 666, 435, 239, 568, 899, 782, 626, 621, 458, 678, 360, 667, 459, 350, 246, 192, 901, 592, 788, 437, 849, 783, 627, 679, 466, 408, 669, 351, 572, 708, 247, 461, 441, 364, 682, 790, 629, 250, 683, 600, 574, 905, 804, 865, 791, 467, 710, 251, 412, 366, 482, 575, 633, 469, 372, 424, 224, 794, 690, 685, 711, 656, 913, 253, 367, 604, 414, 483, 806, 795, 714, 473, 415, 374, 320, 691, 616, 606, 807, 485, 428, 836, 715, 929, 797, 693, 664, 375, 810, 240, 607, 722, 620, 489, 378, 456, 430, 717, 697, 811, 838, 723, 818, 379, 436, 961, 668, 431, 622, 813, 839, 497, 352, 784, 381, 460, 248, 738, 680, 628, 725, 438, 900, 623, 842, 819, 670, 739, 729, 843, 821, 630, 439, 462, 671, 902, 442, 252, 684, 576, 792, 468, 463, 368, 850, 741, 631, 845, 825, 903, 443, 634, 712, 254, 686, 851, 470, 416, 745, 906, 796, 635, 692, 445, 687, 255, 866, 853, 471, 484, 376, 808, 907, 716, 608, 474, 637, 798, 753, 694, 867, 914, 857, 799, 486, 475, 432, 909, 380, 695, 718, 812, 915, 869, 698, 487, 724, 477, 719, 840, 930, 490, 382, 814, 624, 699, 917, 873, 491, 440, 726, 820, 383, 815, 701, 672, 931, 727, 498, 464, 740, 921, 844, 493, 881, 822, 632, 730, 499, 444, 962, 933, 823, 742, 846, 731, 904, 963, 501, 446, 472, 256, 826, 688, 852, 636, 937, 847, 743, 733, 827, 447, 746, 965, 505, 854, 638, 908, 696, 476, 945, 800, 747, 829, 855, 639, 868, 488, 720, 969, 754, 910, 858, 478, 749, 700, 916, 755, 870, 911, 479, 384, 859, 977, 492, 816, 728, 871, 757, 918, 861, 702, 874, 932, 494, 919, 993, 703, 761, 824, 500, 875, 732, 495, 922, 882, 744, 848, 502, 448, 934, 877, 923, 734, 828, 883, 503, 935, 964, 925, 735, 640, 506, 938, 748, 830, 856, 885, 507, 939, 831, 966, 480, 750, 889, 912, 946, 860, 509, 756, 941, 967, 751, 872, 970, 947, 862, 704, 758, 971, 920, 496, 949, 863, 759, 876, 978, 762, 973, 953, 924, 979, 878, 763, 504, 936, 736, 884, 994, 879, 926, 981, 765, 995, 832, 886, 927, 508, 940, 985, 887, 752, 997, 968, 890, 942, 510, 948, 1001, 891, 943, 511, 864, 972, 760, 950, 893, 1009, 974, 951, 764, 954, 980, 880, 975, 955, 928, 766, 982, 957, 767, 888, 996, 983, 986, 998, 944, 987, 892, 512, 999, 989, 1002, 894, 952, 895, 1003, 976, 1010, 956, 1005, 1011, 984, 958, 768, 1013, 959, 988, 1017, 1000, 990, 991, 896, 1004, 1006, 1012, 1007, 960, 1014, 1015, 1018, 1019, 992, 1021, 1008, 1016, 1020, 1022, 1023, 1024)

In a disclosed embodiment, it may be possible to perform encoding based on an order of part of a sequence. In detail, it may be possible to perform encoding based on indices from $(2^{\wedge}(n1)-1)^{th}$ index to $(2^{\wedge}(n2)-1)^{th}$ index (n1<n2<n) of a sequence of $2^{\wedge}n$ indices. In more detail, it may be possible to perform encoding based on an order of indices located in a predetermined region of the sequence.

Figure 8:
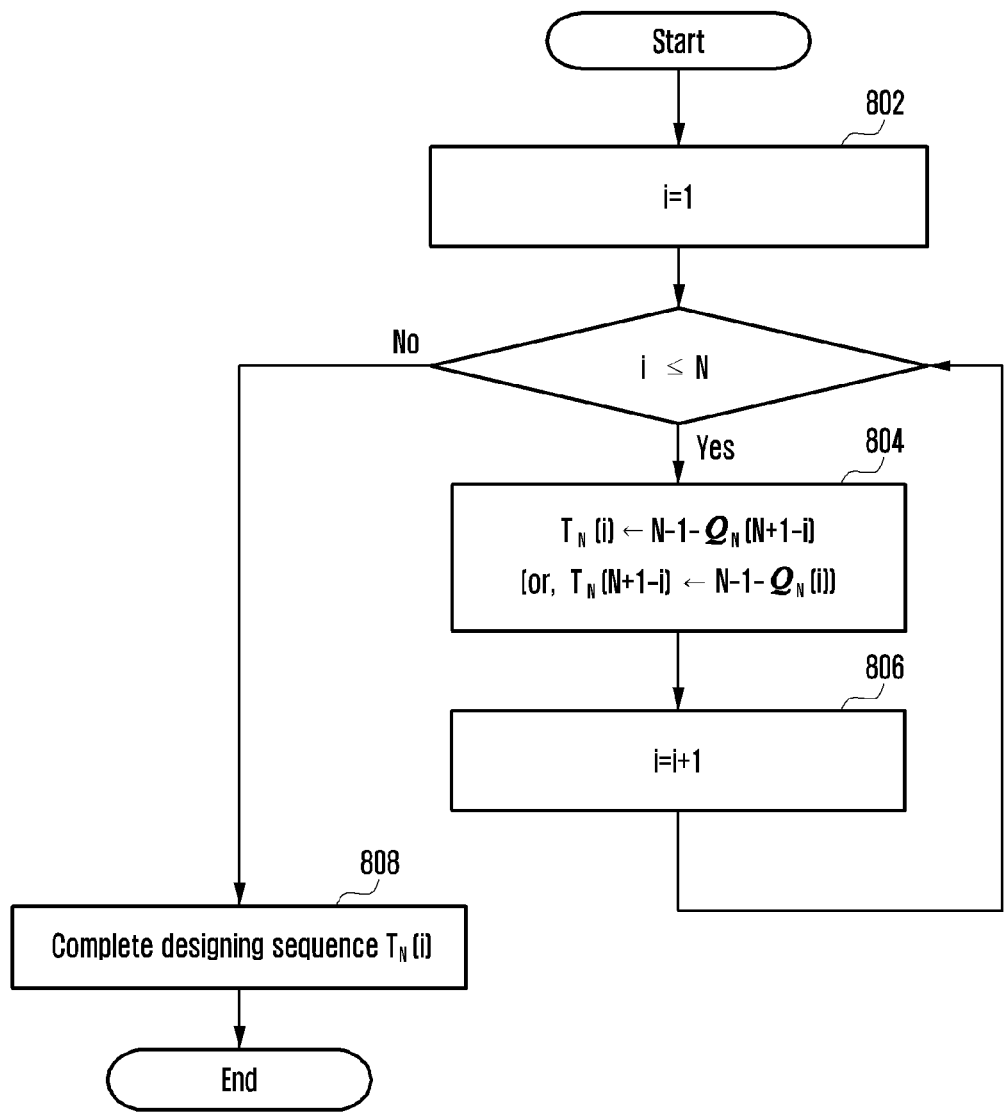
FIG. 8 is a flowchart illustrating a method for generating a symmetrically-structured single sequence according to a disclosed embodiment.

FIG. 8 is a flowchart illustrating a method for generating a symmetrically-structured single sequence according to a disclosed embodiment.

In reference to FIG. 8, it may be possible to set an index i to 1 at step 802 and compare the index value with N. It may be possible to execute N loops to generate a symmetric sequence $T_N$ at step 804. Here, the sequence $T_N$ may be generated in order from $T_N(1)$ to $T_N(N)$ or in reverse order from $T_N(N)$ to $T_N(1)$.

Figure 9:
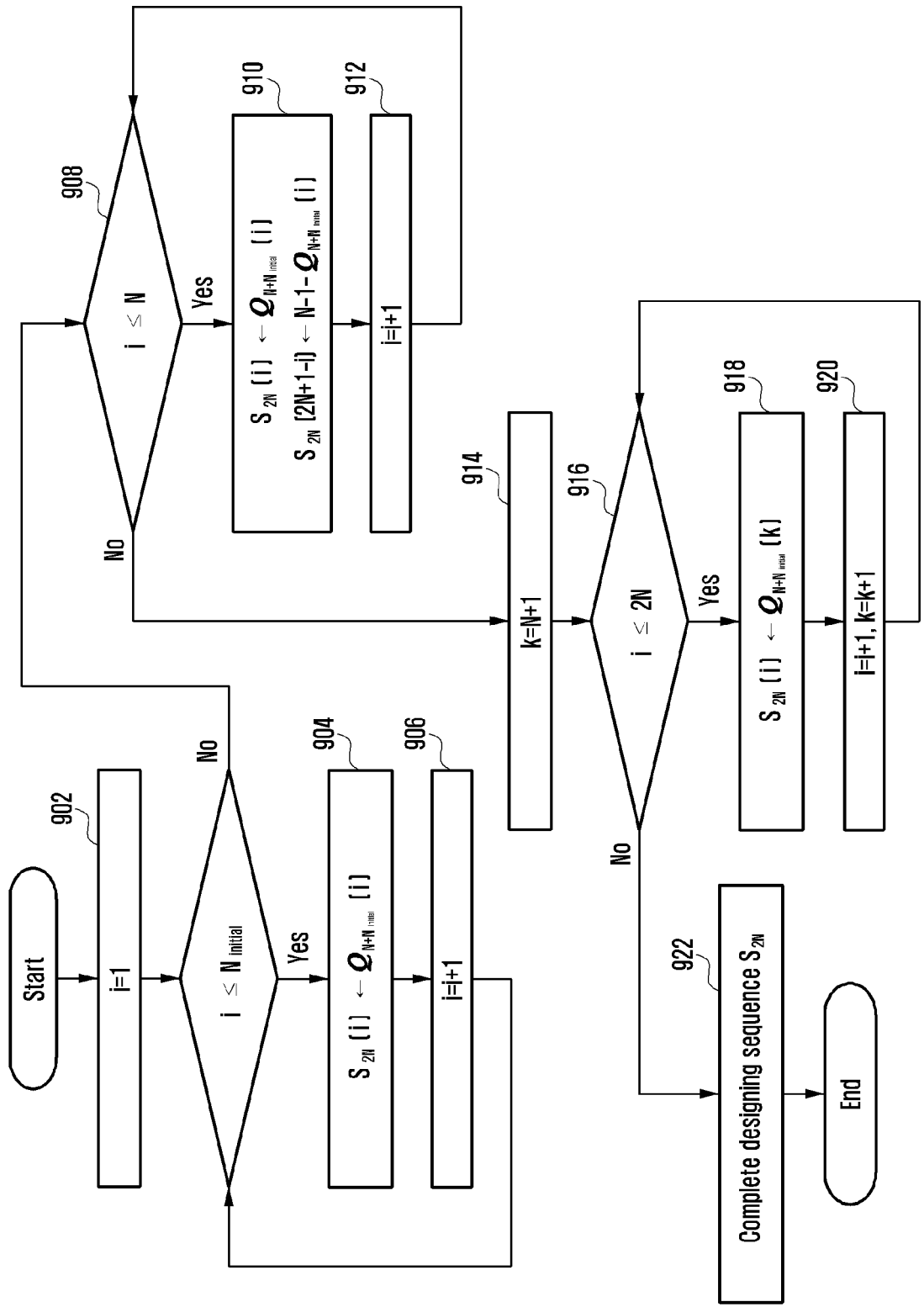
FIG. 9 is a flowchart illustrating a method for generating a whole sequence based on information stored for generating a partially symmetrically structured sequence according to a disclosed embodiment.

FIG. 9 is a flowchart illustrating a method for generating a whole sequence based on information stored for generating a partially symmetrically structured sequence according to a disclosed embodiment.

In reference to FIG. 9, it may be possible to set in index i to 1 at step 902 and compare the index value with N.

The flowchart includes a process of generating an asymmetric sequence at steps 904 and 918 and a process of generating a symmetric sequence at step 910. It may be possible to generate an asymmetric sequence at step 904 by reading $N_{initial}$ indices from a stored sequence Q and a symmetric index sequence at step 910 using the method as described with reference to FIG. 8. It may be possible to complete designing a sequence $S_{2N}$ at step 918 by reading indices from the remaining part of the sequence Q. This disclosed embodiment is directed to a case where the final sequence includes an asymmetric structure made up of $N_{initial}$ best channel indices and $N_{initial}$ worst channel indices; in this case, the indices to be included in the asymmetric structure are generated at step 904, and the indices to be included in the symmetric structure are generated at step 914 according to the location of the asymmetric structure.

Figure 10A:
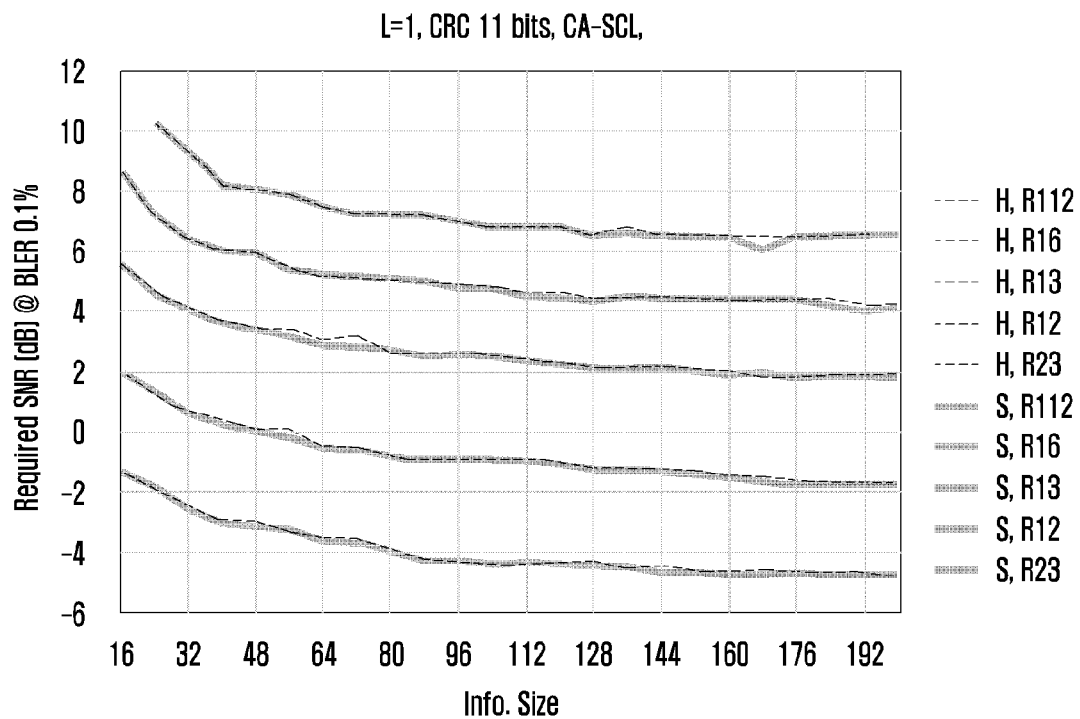
FIGS. 10A and 10B are diagrams illustrating graphs showing comparative performance simulation results between a PW sequence and a symmetrically-structured sequence proposed in a disclosed embodiment for polar coding.
Figure 10B:
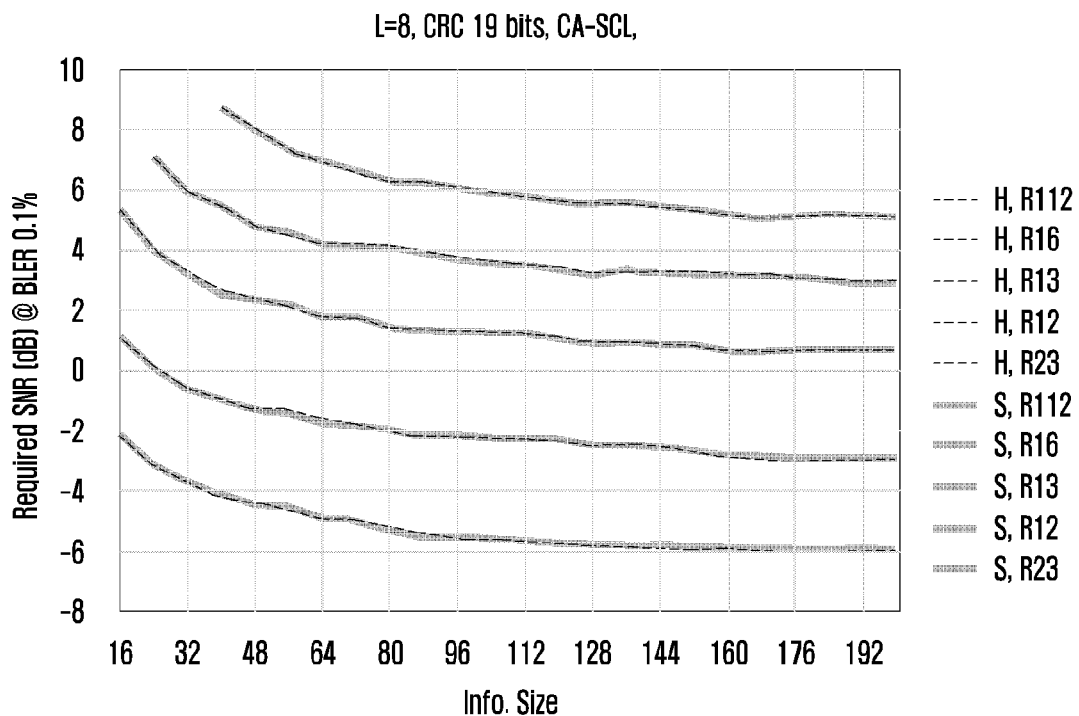

FIGS. 10A and 10B are diagrams illustrating graphs showing comparative performance simulation results between a PW sequence and a symmetrically-structured sequence proposed in a disclosed embodiment for polar coding.

FIGS. 10A and 10B show performance comparisons between the PW sequence and the symmetrically-structured sequence designed according to a disclosed embodiment. The PW sequence is marked with H, and the proposed sequence is marked with S. It is observed from FIG. 10B that the two sequences show similar required SNR performances and from FIG. 10A that the proposed sequence shows a superior performance.

Figure 11A:
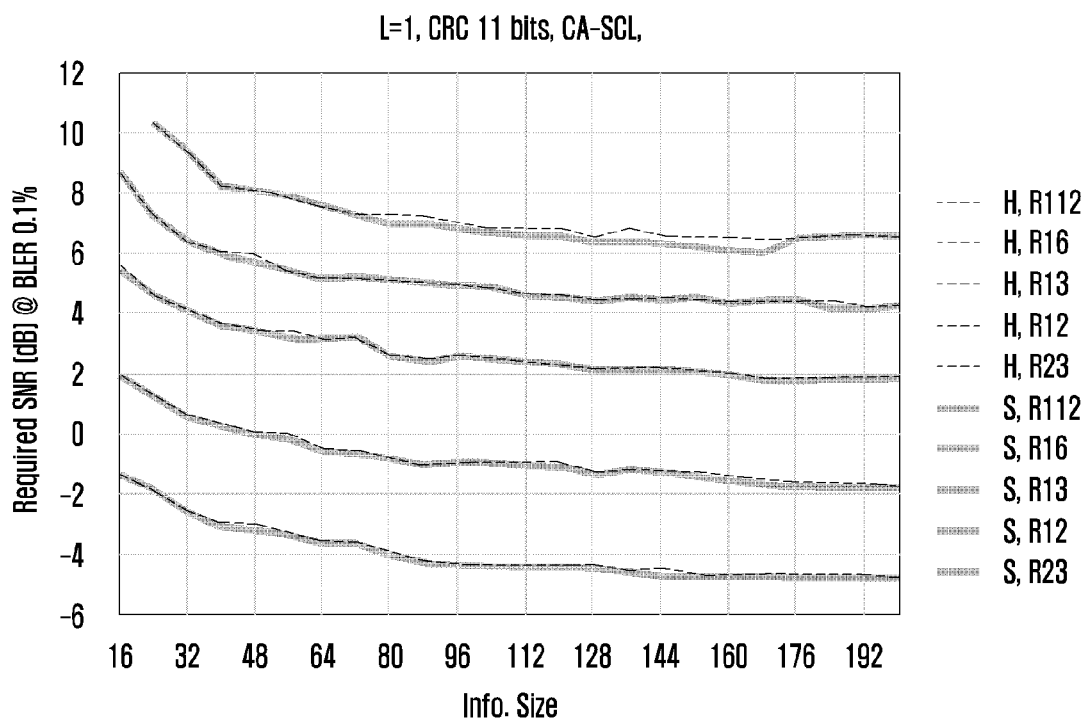
FIGS. 11A and 11B are diagrams illustrating graphs showing comparative performance simulation results between a PW sequence and a partially symmetrically-structured sequence proposed in a disclosed embodiment for polar coding.
Figure 11B:
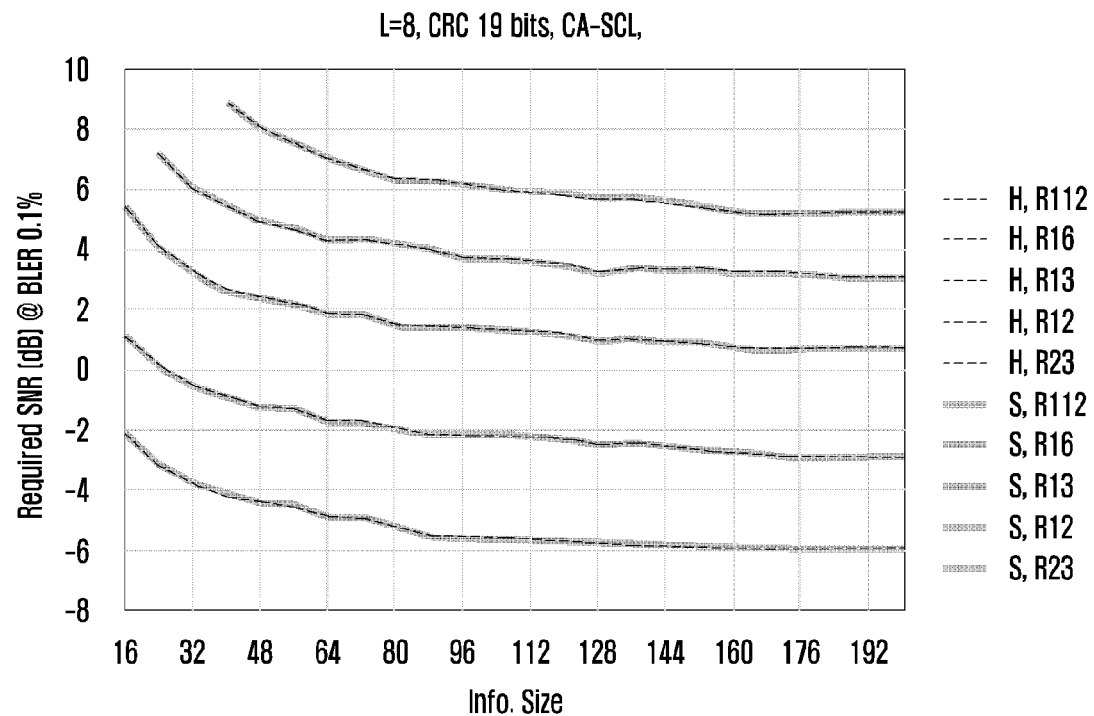

FIGS. 11A and 11B are diagrams illustrating graphs showing comparative performance simulation results between a PW sequence and a partially symmetrically-structured sequence proposed in a disclosed embodiment for polar coding.

FIGS. 11A and 11B show performance comparisons between the PW sequence and the partially-symmetrically structured sequence designed according to a disclosed embodiment. The PW sequence is marked with H, and the proposed sequence is marked with S. It is observed from FIG. 11A that the proposed sequence is superior in performance to the conventional sequence at L=1. It is also observed that the proposed partially symmetrically-structured sequence shows further performance improvement in comparison with the proposed symmetrically-structured sequence.

Figure 12:
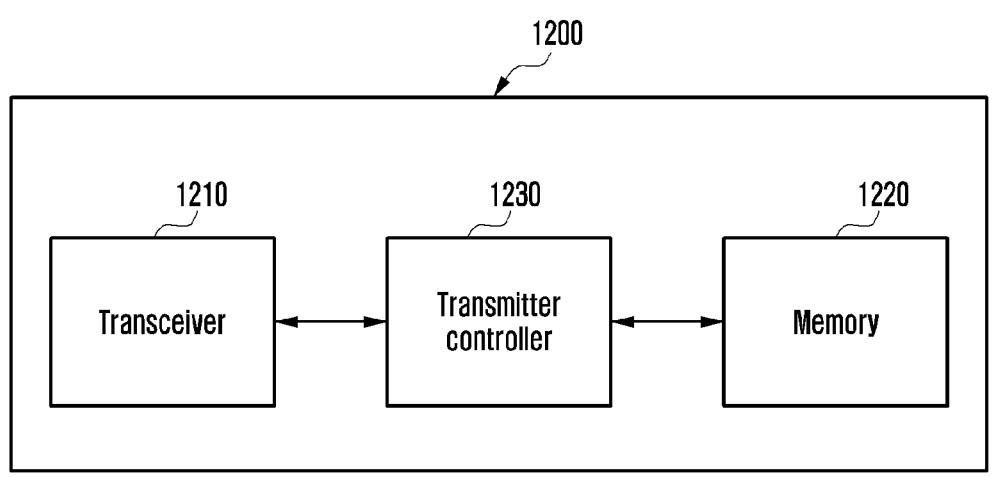
FIG. 12 is a block diagram illustrating a configuration of a transmitter according to a disclosed embodiment.

FIG. 12 is a block diagram illustrating a configuration of a transmitter according to a disclosed embodiment.

In reference to FIG. 12, the transmitter 1200 may include a transceiver 1210, a memory 1220, and a controller 1230.

The transceiver 1210 may communicate signals with a receiver.

The memory 1220 may store at least one of information related to the transmitter 1200 and information being transmitted and received by the transceiver 1210. In an embodiment, the memory 1220 may store information related to a sequence for use by the transmitter to perform polar coding. In detail, the memory 1220 may store parameter values as in the above-described embodiments.

The controller 1230 may control operations of the transmitter 1230 and perform polar coding to transmit a signal to a transmitter as described in the above embodiments. The controller may also generate a sequence for polar coding or perform polar coding with a previously generated sequence. In an embodiment, a sequence for polar coding may be generated by a separate device and stored in the memory 1220.

Figure 13:
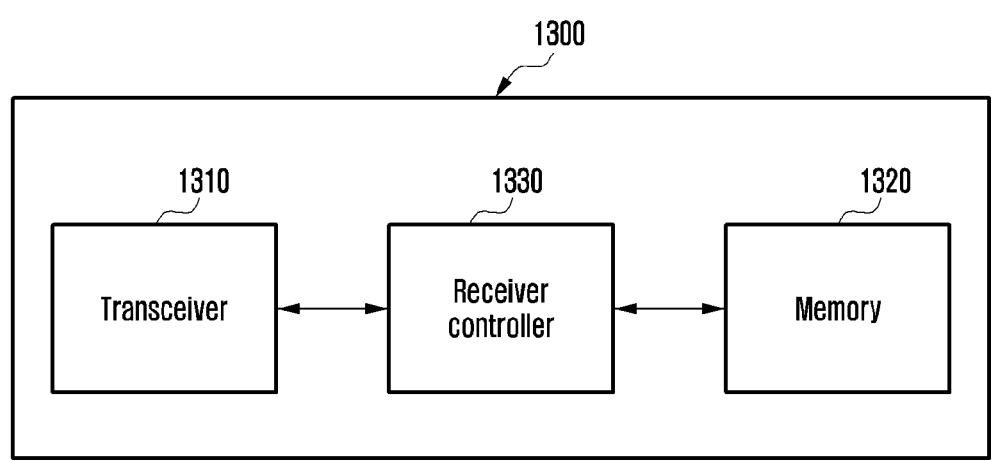
FIG. 13 is a block diagram illustrating a configuration of a receiver according to a disclosed embodiment.

FIG. 13 is a block diagram illustrating a configuration of a receiver according to a disclosed embodiment.

The transceiver 1310 may communicate signals with a transmitter.

The memory 1320 may store at least one of information related to the receiver 1300 and information being transmitted and received by the transceiver 1310. In an embodiment, the memory 1320 may store information related to a sequence for decoding information polar-coded by the transmitter. In detail, the memory may store parameter values as in the above-described embodiments.

The controller 1330 may control operations of the receiver 1300 and decode a polar-coded signal transmitted by the transmitter as described in the above embodiments. The controller may also control overall operations for communicating polar-coded signals with the transmitter.

A method for generating an index sequence for a polar code according to a disclosed embodiment is capable of generating the sequence for the polar code in such a way of designing a polar code sequence optimized at multiple code rates for polar coding, arranging bit channel indices in a descending order from the best to the worst channel conditions at each of the multiple code rates, and inserting the bit channel indices selected for use in transmitting data from the lowest to the highest code rates into a final bit channel index sequence.

It may be possible to use the index sequence generation method in a procedure for generating a 2N-length symmetrically-structured sequence using a code generated at code length $N=2^n$. It may be possible to provide a sequence design method that is capable of reducing performance degradation that is likely to occur with a 2N-length code to a target level while maintaining the sequence designed at length N as far as possible.

A device for transmitting data coded with a polar coding scheme in a communication system according to a disclosed embodiment may include a transceiver for transmitting/receiving the data coded in the polar coding scheme in a wireless channel band, a memory for storing polar code sequences, a polar code encoder for polar-coding the data to be transmitted, and a controller for controlling to determine a length of data to be transmitted, a code rate of the polar code, and a target error rate, selecting a polar coding sequence corresponding to the length of the data, the code rate of the polar code, and the target error rate among polar coding sequences stored in the memory, encoding the data using the selected polar coding sequence, and transmitting the polar-coded data, wherein the polar coding sequences stored in the memory may be designed to be optimized at multiple code rates for polar coding and may arrange bit channel indices in a descending order from the best to worst channel conditions per multiple code rates, and the bit channel indices indicating the channels having best conditions per multiple code rates may be an N-length sequence that is symmetrical with a previously designed N-length sequence.

A method for transmitting data coded with a polar coding scheme in a communication system according to a disclosed embodiment may include determining a length of data to be transmitted, a code rate of the polar code, and a target error rate, selecting a polar coding sequence corresponding to the length of the data, the code rate of the polar code, and the target error rate among polar coding sequences stored in the memory, encoding the data using the selected polar coding sequence, and transmitting the polar-coded data, wherein the polar coding sequences may be a single sequence designed to be optimized at multiple code rates for polar coding, may arrange bit channel indices in a descending order from the best to worst channel conditions per multiple code rates, and may have a 2N-Length symmetrical structure based on a sequence designed at a specific code length of N.

The polar code sequence generation method may also design a partially symmetrically structured sequence as well as a 2N-length symmetrically-structured sequence.

Although the embodiments of the disclosure have been described using specific terms, the specification and drawings are to be regarded in an illustrative rather than a restrictive sense in order to help understand the disclosure. It is obvious to those skilled in the art that various modifications and changes can be made thereto without departing from the broader spirit and scope of the disclosure.

The invention claimed is:

1. An information transmission method comprising:
identifying at least one information bit for polar coding;
identifying a first sequence having a length of 2N that corresponds to a length of the at least one information bit;
encoding the at least one information bit through polar coding based on a first sequence; and
transmitting the encoded at least one information bit,
wherein the first sequence comprising indices that form part of the first sequence is arranged symmetrically around a center of the first sequence.

2. The method of claim 1, wherein the first sequence is generated based on a second sequence having an error rate equal to or less than a first threshold value for a code length N and a third sequence having the code length N, the second and third sequences being arranged based on encoding gains corresponding to individual indices that are compared with each other to be allocated in the first sequence in order from an index having a highest encoding gain.

3. The method of claim 2, further comprising:
comparing the encoding gains of the individual indices in the second sequence with a second threshold value; and
allocating an index having a highest encoding gain, among indices remaining in the
second and third sequences without being allocated in the first sequence, in the first sequence based on the encoding gains being not equal to or greater than the second threshold value.

4. The method of claim 2, wherein the first sequence comprises a first section and a second section, a first set including a predetermined number of indices being selected in order from a greatest encoding gain from the second and third sequences is allocated in the first section in order from the greatest encoding gain, and a second set including a predetermined number of indices selected in order from a least encoding gain from the second and third sequence is allocated in the second section in order from the least encoding gain.

5. The method of claim 4, wherein indices being placed between the first and second sections are allocated symmetrically around the center of the first sequence, and the predetermined number of indices is determined based on a target error rate.

6. The method of claim 3, wherein the second threshold value is determined based on a target error rate.

7. An information transmission apparatus comprising:
a transceiver configured to transmit and receive signals; and
at least one processor connected to the transceiver and configured to control to identify at least one information bit for polar coding, identify a first sequence having a length 2N that corresponds to a length of the at least one information bit, encode the at least one information bit through polar coding based on a first sequence, and transmit the encoded at least one information bit, wherein the first sequence comprising indices that form part of the first sequence arranged symmetrically around a center of the first sequence.

8. The information transmission apparatus of claim 7, wherein the first sequence is generated based on a second sequence having an error rate equal to or less than a first threshold value for a code length N and a third sequence having the code length N, the second and third sequences being arranged based on encoding gains corresponding to individual indices that are compared with each other to be allocated in the first sequence in order from an index having a highest encoding gain.

9. The information transmission apparatus of claim 8, wherein the at least one processor is configured to control to compare the encoding gains of the individual indices in the second sequence with a second threshold value and allocate an index having a highest encoding gain, among indices remaining in the second and third sequences without being allocated in the first sequence, in the first sequence based on the encoding gains being not equal to or greater than the second threshold value.

10. The information transmission apparatus of claim 8, wherein the first sequence comprises a first section and a second section, a first set including a predetermined number of indices being selected in order from a greatest encoding gain from the second and third sequences that is allocated in the first section in order from the greatest encoding gain, and a second set including a predetermined number of indices selected in order from a least encoding gain from the second and third sequence that is allocated in the second section in order from the least encoding gain.

11. The information transmission apparatus of claim 10, wherein indices being placed between the first and second sections are allocated symmetrically around the center of the first sequence, and the predetermined number of indices is determined based on a target error rate.

12. The information apparatus of claim 9, wherein the second threshold value is determined based on a target error rate.

13. An information reception method comprising:
receiving information encoded through polar coding;
identifying a first sequence having a length of 2N; and
decoding the received information based on the first sequence,
wherein the first sequence comprising indices that form part of the first sequence is arranged symmetrically around a center of the first sequence.

14. An information reception apparatus comprising:
a transceiver configured to transmit and receive signals; and
a controller connected to the transceiver and configured to control to receive information encoded through polar coding, identify a first sequence having a length of 2N, and decode the received information based on the first sequence, wherein the first sequence comprising indices that form part of the first sequence is arranged symmetrically around a center of the first sequence.

15. A non-transitory storage medium storing instructions, which upon being executed, cause at least one processor to perform:

identifying at least one information bit for polar coding;

identifying a first sequence having a length of 2N that corresponds to a length of the at least one information bit;

encoding the at least one information bit through polar coding based on a first sequence; and transmitting the encoded at least one information bit, wherein the first sequence comprising indices that form part of the first sequence is arranged symmetrically around a center of the first sequence.

* * * * *